US006556504B2

(12) United States Patent
Kwon et al.

(10) Patent No.: US 6,556,504 B2
(45) Date of Patent: Apr. 29, 2003

(54) NONVOLATILE SEMICONDUCTOR MEMORY DEVICE AND DATA INPUT/OUTPUT CONTROL METHOD THEREOF

(75) Inventors: Seok-Cheon Kwon, Kyunggi-do (KR); Young-Joon Choi, Kyunggi-do (KR)

(73) Assignee: Samsung Electronics Co., Ltd., Suwon (KR)

(*) Notice: Subject to any disclaimer, the term of this patent is extended or adjusted under 35 U.S.C. 154(b) by 0 days.

(21) Appl. No.: 09/993,005

(22) Filed: Nov. 14, 2001

(65) Prior Publication Data

US 2002/0085419 A1 Jul. 4, 2002

(30) Foreign Application Priority Data

Jan. 4, 2001 (KR) .................................... 2001-0000346

(51) Int. Cl.[7] .................................................. G11C 8/00

(52) U.S. Cl. ............................ 365/230.08; 365/189.05; 365/189.02; 365/221; 365/339

(58) Field of Search ....................... 365/189.05, 185.18, 365/189.12, 221, 230.08, 239

(56) References Cited

U.S. PATENT DOCUMENTS

| | | | | | |
|---|---|---|---|---|---|
| 5,691,954 A | * | 11/1997 | Ooishi | ................... | 365/230.08 |
| 6,097,666 A | * | 8/2000 | Sakui et al. | ........... | 365/230.06 |
| 6,222,790 B1 | * | 4/2001 | Ooishi | ................... | 365/230.08 |
| 6,288,940 B1 | * | 9/2001 | Kawamura | ............. | 365/185.09 |

* cited by examiner

*Primary Examiner*—Son T. Dinh
*Assistant Examiner*—Nam Nguyen
(74) *Attorney, Agent, or Firm*—F. Chau & Associates, LLP

(57) ABSTRACT

A nonvolatile semiconductor memory device comprises an address buffer, a column address register, a selection circuit, a data input/output circuit, and a controller. The controller controls the column address changes of the memory device during the read/write operation. When external addresses are applied to a first input/output pins while data is transferred from a second input/output pins to an internal register or is transferred from the internal register to the second input/output pins through the data input/output circuit, the control circuit stores the external addresses in the column address register as a column address. A page size of the nonvolatile semiconductor memory device having such a column address change function can be increased irrespective of a memory system.

38 Claims, 18 Drawing Sheets

NONVOLATILE SEMICONDUCTOR MEMORY DEVICE AND DATA INPUT/OUTPUT CONTROL METHOD THEREOF

RELATED APPLICATION

This application claims priority upon Korean Patent Application No. 2001-00346, filed on Jan. 4, 2001, the contents of which are herein incorporated by reference in their entirety.

FIELD OF THE INVENTION

The present invention generally relates to a nonvolatile semiconductor memory device. More specifically, the present invention is directed to a nonvolatile semiconductor memory device capable of changing a column address while inputting/outputting a data column to/from the memory device and method for controlling data input/output thereof.

BACKGROUND OF THE INVENTION

A rewritable nonvolatile semiconductor memory device, such as, a NAND-type flash memory device, has an array of strings formed from a plurality of memory cells that are serially connected between a string selection transistor and a ground selection transistor. In a writing (or programming) operation of the NAND-type flash memory device, as shown in FIG. 15, when signal of a data input command, successive column and row addresses for assigning memory cells are inputted. And, specific-unit data is synchronized with a successive low-to-high transition of a write enable signal $\overline{WE}$, as a data input signal, and is successively inputted through input/output pins I/Oi (i=0–7). The inputted data is temporarily stored in latches of a register or a page buffer circuit. Thereafter, the temporarily stored data is programmed. In a read operation of the NAND-type flash memory device, as shown in FIG. 16, upon a read command, successive column and row addresses for assigning memory are inputted. And then, data of the assigned column and row addresses is read or sensed during a low interval of an $R/\overline{B}$ signal. The sensed data is temporarily stored in latches of a register or a page buffer circuit that is located in the memory device. Finally, specific-unit data stored in the register is synchronized with a successive high-to-low transition of a read enable signal $\overline{RE}$, as a data output signal, and is successively outputted through the input/output pins I/Oi (i=0–7).

In the NAND-type flash memory device, the specific-unit is conventionally called "page". The NAND-type flash memory device can be applied to a solid-state file storage, a digital voice recorder, a digital still camera or a portable system that needs nonvolatility. The NAND-type flash memory device can operate reading and programming operations at higher speed by expanding the number of memory cells to be sensed/programmed at the same time or expanding a page size to improve reading or programming speed per 1-byte.

FIG. 17 schematically illustrates a flash memory system, which includes a host 10, a memory controller 20, and an NAND-type flash memory device 30. The memory controller 20 includes a control unit 22 and a buffer memory 24. The buffer memory comprises a first data storage area (A) having 2 KB storage capacity and a second data storage area (B) having 64 B storage capacity. The NAND-type flash memory device 30 is controlled by a memory controller 20, and includes a memory cell array and a page buffer circuit 36 or a register. The memory cell array is divided into a main field array 32 and a spare field array 34. Normal data is stored in the main field array 32, while additional data information associated with the normal data is stored in the spare field array 34. The additional data information includes error correction and detection code (ECC) data, address mapping data, and wear levelling data. If a page size of the NAND-type flash memory device is "2 KB+64 B", memory cells corresponding to 64 B occupy one page of the spare field array 34. The use of wear levelling data is described in U.S. Pat. No. 5,568,423 entitled "FLASH MEMORY WEAR LEVELLING SYSTEM PROVIDING IMMEDIATE DIRECT ACCESS TO MICROPROCESSOR".

For example, when a size of a page being a specific-unit of a writing or reading operation in a memory device is "2 KB+64 B", 2 KB is allocated to store normal data, and 64 B is allocated to additional data. If a writing operation of the flash memory device is performed in the memory system shown in FIG. 17, the host 10 sequentially transmits normal data of 2 KB to the memory controller 20 with a unit of 512 B. The memory controller 20 temporarily stores the transmitted normal data of 2 KB in the first data storage area (A) of the buffer memory 24. A control unit 22 of the memory controller 20 generates additional data of 64 B, in which the additional data has error correction and detection code data, address mapping data, and wear levelling data by using the stored normal data of 2 KB in the first data storage area (A). Also, the control unit 22 temporarily stores the generated additional data in the second data storage area (B) of the buffer memory 24.

The memory controller 20 sequentially transfers normal data of 2 KB to the memory device, based upon an input/output structure of an NAND-type flash memory device. The NAND-type flash memory device 30 temporarily stores the sequentially transferred normal data of 2 KB in a page buffer area of 2 KB corresponding to the main field array 32. Thereafter, the memory controller 20 sequentially transfers additional data of 64 KB to the memory device, based upon the input/output structure of the NAND-type flash memory device. The NAND-type flash memory device 30 temporarily stores the sequentially transferred additional data of 64 B in a gate buffer area of 64 B corresponding to the spare field array 34. After completely inputting the "2 KB+64 B" data, the data stored in the page buffer 36 or the register based upon the input of a program instruction is programmed at the same time.

FIG. 18 schematically illustrates another memory system having a flash memory device. in the system of FIG. 18, a memory controller 20 has a buffer memory 24' that is smaller than a page size of a NAND-type flash memory device 30'. The buffer memory 24' includes of a first data storage area (A') of 512 B for storing normal data and a second data storage area (B') of 16 B for storing additional data. The NAND-type flash memory device 30' has the same page size of"2 KB+64 B" as that shown in FIG. 17, and is controlled by a memory controller 20'. When a NAND-type flash memory device having a page size larger than a buffer memory 24' of the memory controller 20' is applied to the system, the following problem occurs.

If a writing operation of a flash memory device is performed in a memory system as shown in FIG. 18, a host 10' transfers normal data of 512 B to a memory controller 20'. The memory controller 20' temporarily stores the transferred normal data of 512 B in a first data storage area (A') of a buffer memory 24'. By using the stored normal data of 512 B, a control unit 22' of the memory controller 20' generates additional data of 16 B that includes error correction and detection code data, address mapping data, and wear leveling data. Also, the control unit 22' temporarily stores the generated additional data in a second data storage area (B') of the buffer memory 24'.

The memory controller 20' sequentially transfers normal data of 512 B to a NAND-type flash memory device, based upon an input/output structure of the memory device. The NAND-type flash memory device 30' temporarily stores the sequentially transferred normal data of 512 B in a page buffer circuit 36' and a register. Thereafter, the memory controller 20' sequentially transfers additional data of 16 B to the NAND-type flash memory device, based upon an input/output structure of the memory device. The NAND-type flash memory device 30' temporarily stores the sequentially transferred additional data of 16 B to the page buffer circuit 36' or the register. Since a page size of the NAND-type flash memory device 30' is "2 KB+64 B", the additional data of 16 B is not allocated to a page buffer area of 64 B corresponding to the spare filed array 34' of the NAND-type flash memory device 30', but is successively allocated to the page buffer area of 2 KB corresponding to a main field array 32', That is, as shown in FIG. 18, the additional data of 16 B is stored with the normal data of 512 B in the page buffer area of 2 KB.

Therefore, there is a need for a nonvolatile semiconductor memory device that is able to achieve high-speed reading and writing operations, and a data input/output control method thereof.

There is also a need for a nonvolatile semiconductor memory device that is able to change a column address during data input/output, and a data input/output control method thereof.

There is a further need for a nonvolatile semiconductor memory device that is able to freely expand a page size irrespective of a buffer memory size of a memory interface, and a data input/output control method thereof.

SUMMARY OF THE INVENTION

An object of the present invention is, therefore, to provide a nonvolatile semiconductor memory device capable of achieving high-speed read and write operations, and a method for controlling data input/output thereof Another object of the present invention is to provide a nonvolatile semiconductor memory device capable of changing a column address during data input/output, and a method for controlling data input/output thereof.

A further object of the present invention is to provide a nonvolatile semiconductor memory device capable of freely expanding a page size irrespective of a buffer memory size of a memory interface, and a method for controlling data input/output thereof.

The foregoing and other objects of the present invention will be achieved by providing a novel and improved nonvolatile semiconductor memory device including a memory and a memory controller, in which the memory includes memory cell arrays arranged in a matrix of rows and columns, and a plurality of latch groups temporarily storing data to be stored/read in/from the array.

In a preferred embodiment, the nonvolatile semiconductor memory device further comprises an address buffer circuit for receiving and storing external addresses data from a first input/output pins; a column address register for receiving the external address stored in the address buffer circuit as a column address, and sequentially increasing the column address; a selection circuit for selecting of a latch group of the plurality of latch groups in response to the column address sequentially outputted from the column address register; a data input/output circuit for transferring data inputted through a second input/output pins to the selected latch group by being synchronized with a data input signal provided from the memory controller, and transferring the data stored in the selected latch group to the second input/output pins by being synchronized with a data output signal provided from the memory controller; and a controller for controlling the address buffer circuit and column address register to store the external address in the column address register when the external addresses are applied to the first input/output pins while the data is transferred from the selected latch group to the second input/output pins or vice versa.

In one preferred embodiment, a flash memory device comprises a memory cell array having electrically erasable and programmable memory cells arranged in a matrix of rows and columns, and a memory controller, in which the memory cell array comprises a main field array and a spare field array. The flash memory device further comprises a plurality of latch groups for temporarily storing data to be stored/read in/from the memory cell array; an address buffer circuit for storing external addresses provided from a first input/output pins; a column address register for receiving and storing an address of the external addresses stored in the address buffer circuit as a column address, and for sequentially increasing the column address; a selection circuit for sequentially selecting a latch group of the plurality of latch groups in response to the column address outputted from the column address register; a data input/output circuit for transferring data sequentially inputted from a second input/output pins to the selected latch group by being synchronized with a data input signal provided from the memory controller, and for transferring the data from the selected latch group to the second input/output pins by being synchronized with a data output signal provided from the memory controller; a command register for generating a flag signal indicating column address change in response to a column-address change command; a short pulse generation circuit for generating a short pulse signal in response to the flag signal; an address input period setting circuit for enabling an address input period signal indicating a predetermined address input period in response to the short pulse signal; and a control logic for controlling the address buffer circuit and the column address register in response to the activation of the address input period signal so that the external address provided to the first input/output pins is stored in the column address register. In the embodiment, the data comprises normal data bits to be stored in the main field array and additional data bits, associated with the normal data bits, to be stored in the spare field array.

In another preferred embodiment, a system includes a memory controller that receives normal data from a host to internally generate additional data associated with the normal data, and has a buffer memory for temporarily storing the normal data and the additional data; and a flash memory device that is coupled to the memory controller, and stores a data comprising the normal data and the additional data.

In other preferred embodiment, a method for controlling data input/output of a nonvolatile semiconductor memory device according to one of the preferred embodiments of the present invention, comprises the steps of: (a) sequentially selecting a latch group of the plurality of latch groups in response to a column address outputted from the column address register; (b) transferring the data to the selected latch group by being synchronized with a data input signal provided from the memory controller; (c) storing an external address in the column address register as a new column address when the external addresses are applied to the memory device while the data is transferred/outputted to/from the selected latch group; and (d) performing the step of (b) according to the new column address.

Additional advantages of the present invention will become readily apparent from the following discussion, particularly when taken with the accompanying drawings.

DESCRIPTION OF PREFERRED EMBODIMENTS

Figure 1:
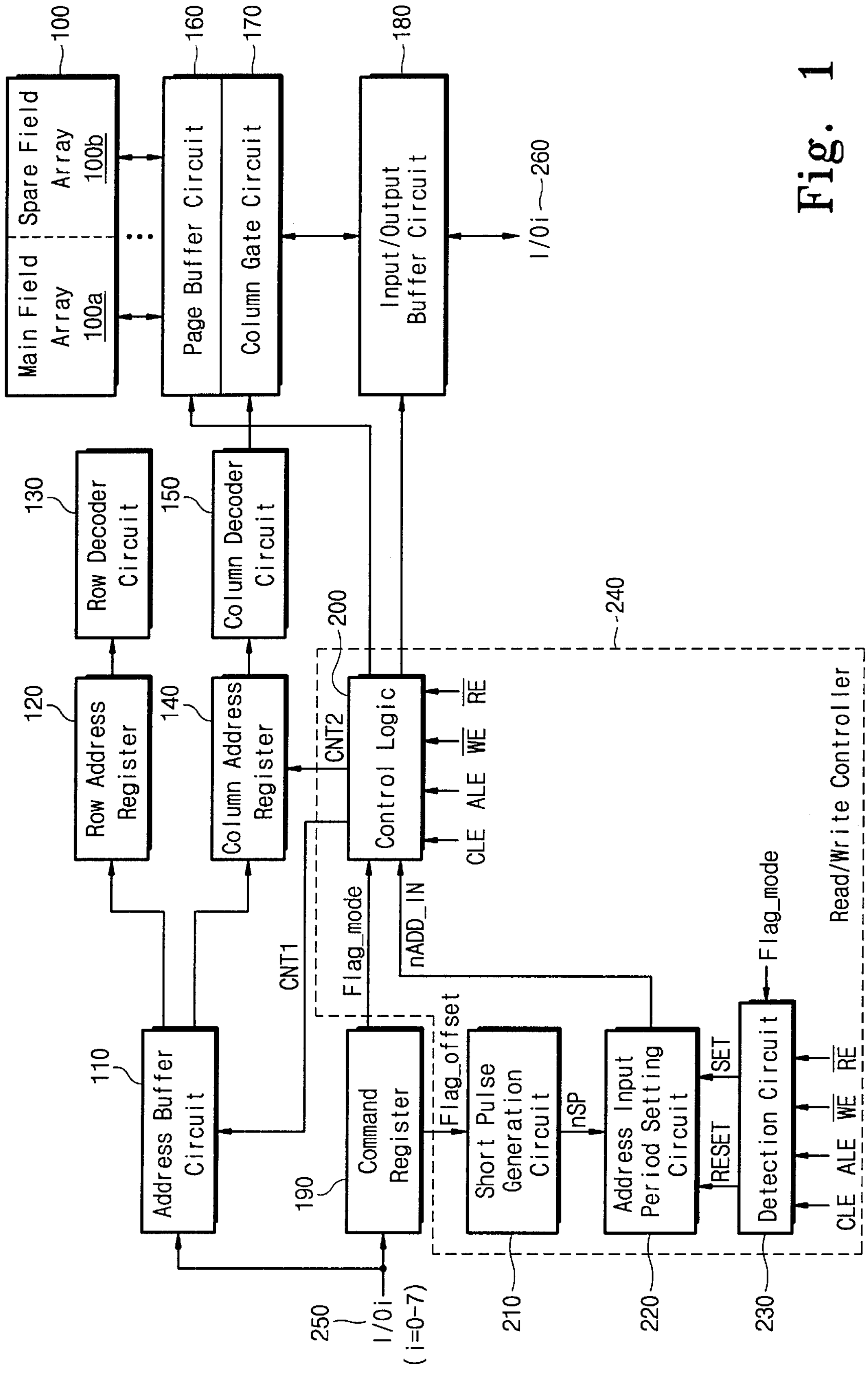
FIG. 1 is a block diagram showing a nonvolatile semiconductor memory device according to a first embodiment of the present invention.

A nonvolatile semiconductor memory device according to a first embodiment of the present invention is shown in FIG. 1. In the first embodiment, the nonvolatile semiconductor memory device is an NAND-type flash memory device with multiplexing input/output pins (or ports). However, it will be understood to those skilled in the art that a memory device with multiplexing input/output pins or any other type memory device may be applied. The NAND-type flash memory device according to the invention has characteristics in changing or updating internal column addresses whenever combination of a specific command and external control signals or an address input condition are created, while read/write (programming) operations. It means that a page size of an NAND-type flash memory device can freely be expanded irrespective of a buffer memory size in a memory interface of a system employing the NAND-type flash memory device, which will be described more fully hereinafter.

Referring to FIG. 1, an NAND-type flash memory device includes a memory cell array 100 including a main field array 100*a* and a spare field array 100*b*. The main field array 100*a* and the spare field array 100*b* include a plurality of strings, respectively. Each of the strings includes a plurality of memory cells serially connected between a string select transistor and a ground select transistor. Each the memory cell is an electrically erasable and programmable cell transistor having a source, a drain, a floating gate, and a control gate. Normal data is stored in the main field array 100*a*, while additional data (including error correction and detection code data, address mapping data, and wear levelling data) associated with the normal data is stored in the spare field array 100*b*.

The NAND-type flash memory further includes an address buffer circuit 110 a row address register 120, a row decoder circuit 130, a column address register 140, a column decoder circuit 150, a page buffer circuit 160, a column gate circuit 170, and an input/output buffer circuit 180. The column decoder circuit 150 and the column gate circuit 170 constitute a selection circuit. The address buffer circuit 110 temporarily stores addresses inputted through a first input/output pins I/Oi (i=0–7) 250. The row address register 120 receives an output of the address buffer circuit 100, as a row address. The row decoder circuit 130 decodes the row address from the row address register 120 to select a row or page of the memory cell array 100. The row address register 120 increases the inputted row address based upon an operation mode (e.g., sequential row read operation mode).

The column address register 140 receives the output of the address buffer circuit 110, as a column address, and sequentially increases the inputted column address. The column decoder circuit 150 decodes the column address outputted from the column address register 140. The page buffer circuit 160 includes, although not shown in the drawing, columns of the main field array 100*a* or bitlines and columns of the spare field array 100*b* or page buffers each corresponding to bitlines. The page buffers has a plurality of latch groups. Each latch group of the page buffers senses data bits stored in a corresponding memory cell, and temporarily stores (or latches) the sensed data bits. The column gate circuit 170 sequentially selects a latch group of page buffers in response to decoded signal from the column decoder circuit 150. Data bits stored in the selected latch group are synchronized with a read enable signal $\overline{RE}$, as a data output signal, and transferred to a second input/output pin I/Oi 260 through the input/output buffer circuit 180. In a write (or program) operation, the transferred data bits are temporarily stored in a latch group of page buffers that are sequentially selected by the column gate circuit 170 based upon an output of the column decoder circuit 150. In this case, the number of the latch groups corresponds to that of the second input/output pins 260.

Figure 17:
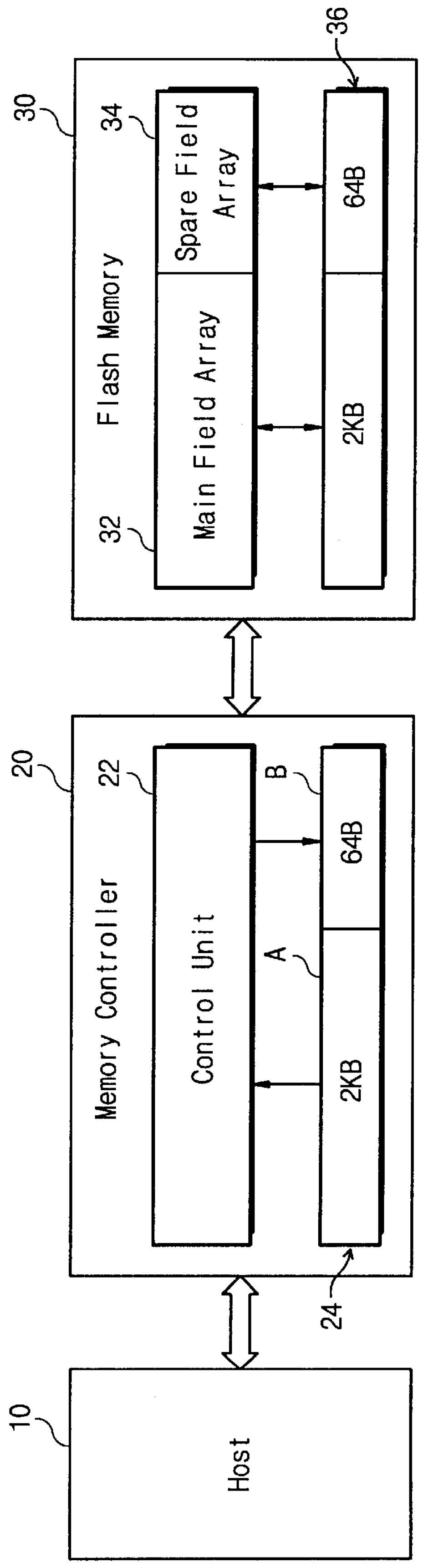
FIG. 17 and FIG. 18 are block diagrams showing a system with a flash memory device of an expanded page size.
Figure 18:
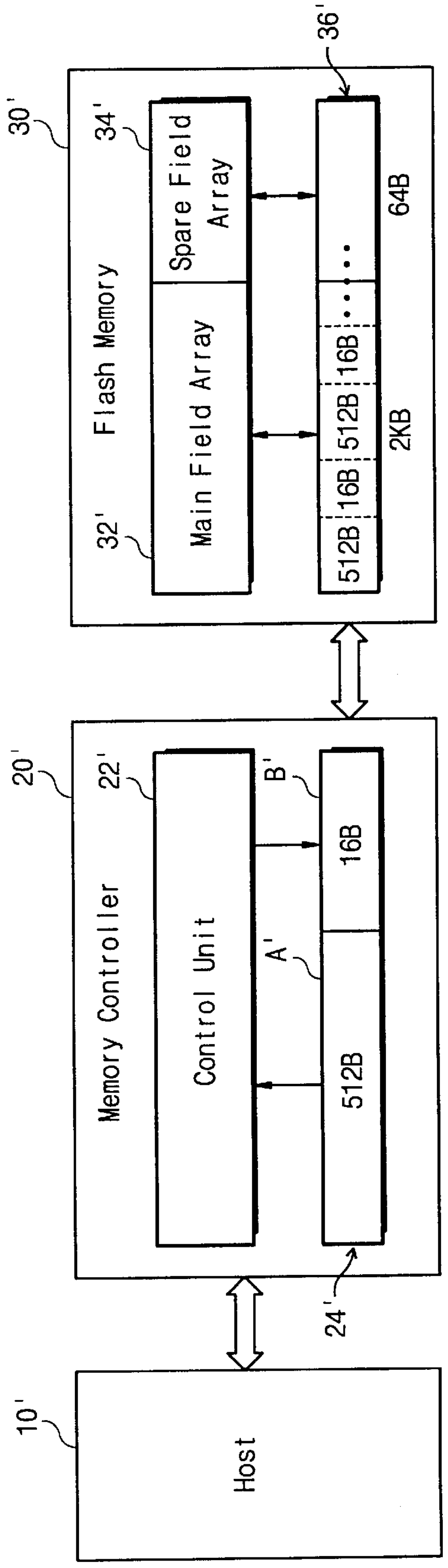

With reference to FIG. 1, the NAND-type flash memory device further includes a command register 190, a control logic 200, a short pulse generation circuit 210, an address input period setting circuit 220, and a detection circuit 230. The control logic 200, the short pulse generation circuit 210, the address input period setting circuit 220, and the detection circuit 230 constitute a read/write controller 240 for controlling general operations of a memory device in read/write operations. The command register 190 stores a command provided through the first input/output pins I/Oi 250, and outputs a flag signal Flag_mode of an operation mode by the inputted command. The control logic 200 generates internal signals for read/write operations, in response to external control signals CLE, ALE, $\overline{WE}$, and $\overline{RE}$ provided from a memory controller 20, 20'(see FIG. 17 and FIG. 18) and the operation mode flag signal Flag_mode provided from the command register 190. The command register 190 also generates an offset change flag signal Flag_offset indicating an offset change of a column address, in response to an offset change command of a column address provided through the first input/output pins 250.

Figure 2:
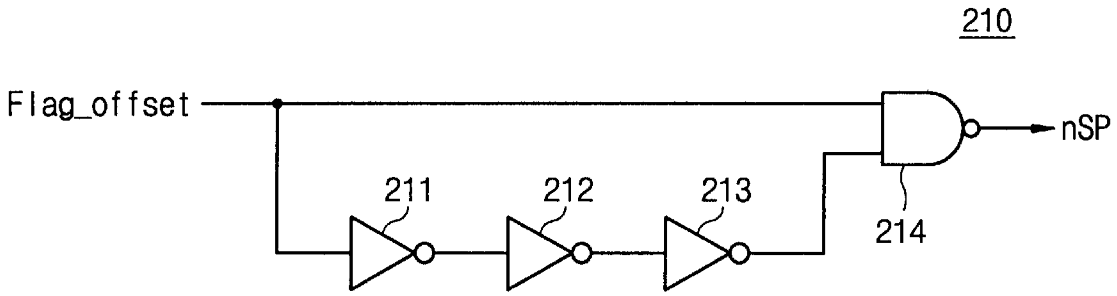
FIG. 2 is a diagram illustrating a preferred embodiment of a short pulse generation circuit shown in FIG. 1.

The Flag_offset outputted from the command register 190 is applied to a short pulse generation circuit 210 that generates a short pulse signal nSP in response to a transition of the Flag_offset. As shown in FIG. 2, the short pulse generation circuit includes three inverters 211, 212, and 213 and one NAND gate 214 connected each other The output nSP of the short pulse generation circuit 210 is applied to an address input period setting circuit 220. The address input period setting circuit 220 enables an address input period signal nADD_IN in response to the short pulse signal nSP. The address input period signal nADD_IN is disabled by a reset signal that is outputted from the address input period signal nADD_IN.

When the address input period signal, nADD_IN is enabled, the control logic 200 controls the address buffer circuit 110 to store addresses inputted to the first input/output pins I/Oi 250. Also, the control logic 200 controls the column address register 140 to receive an address outputted from the address buffer circuit 110 as a column address. In other words, the control logic 200 generates an address input control signal CNT1 and an address latch control signal CNT2 in response to activation of the address input period signal nADD_IN. The address buffer circuit 110 stores the addresses applied to the first input/output pins I/Oi 250 in response to the address input control signal CNT1. The column address register 140 receives the output of the address buffer circuit 110 as a column address in response to the address latch signal CNT2. That is, a column address is externally supplied to the first input/output pins 250 when a read/write operation command or a column address offset change command, and transferred to the column address register 140 through the address buffer circuit 110.

The detection circuit 230 receives the external control signals CLE, ALE, $\overline{RE}$, and $\overline{WE}$ from a memory controller and an operation mode flag signal Flag_mode from the command register 190, and outputs set and reset signals SET and RESET of active low pulse. In this case, the CLE is a command latch enable signal and the ALE is an address latch enable signal. The SET is enabled to have a pulse shape of a predetermined width according to a high-to-low transition of the $\overline{WE}$ only when, for example, ALE='H', CLE='L', and RE='H' (this represents an address input condition) and the Flag_mode is generated. Note that the SET is not generated until a read/write operation command is inputted. The RESET is enabled to have a pulse shape of a predetermined width according to a third low-to-high transition of the $\overline{WE}$. Also, the RESET is generated at each endpoint of an address input period or a third low-to-high transition of the $\overline{WE}$.

In this embodiment, the command register 190 and the read/write controller 20 constitute a controller for controlling the address buffer circuit 110 and the column address register 140, so that the external address supplied to the first input/output pins 250 is stored in the column address register 140 during the data input/output operation of the memory cell array 100.

Figure 3:
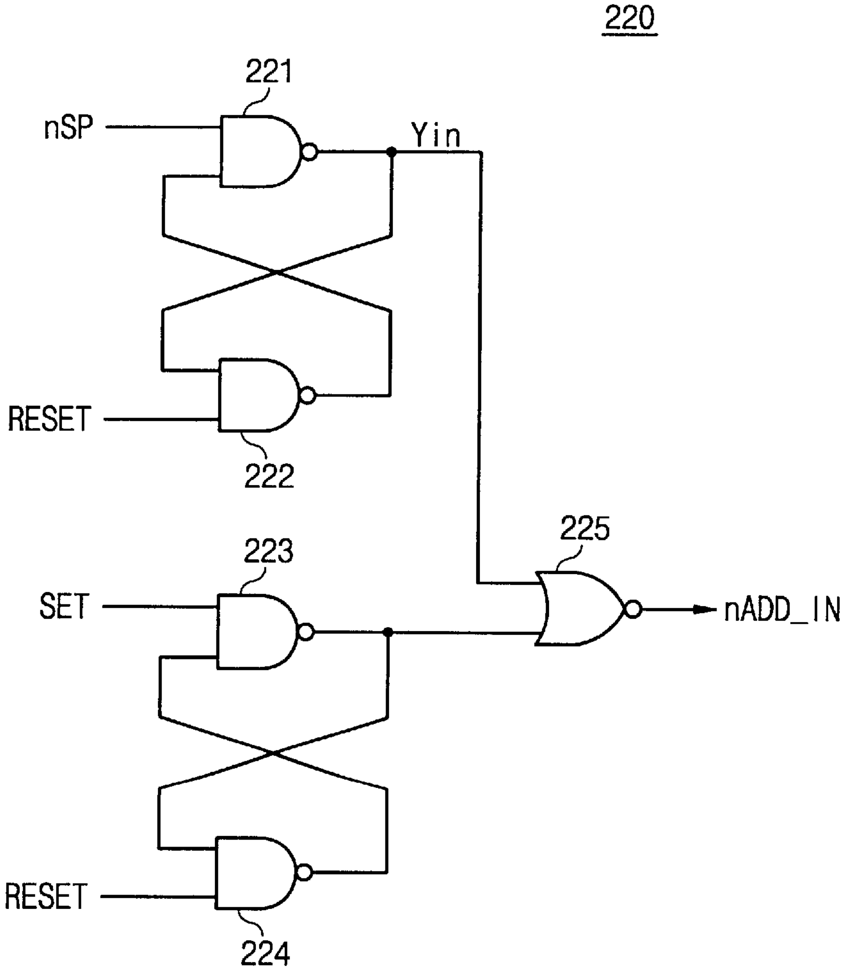
FIG. 3 is a diagram illustrating a preferred embodiment of an address input period setting circuit shown in FIG. 1.

Referring to FIG. 3, the address input period setting circuit 220 includes four NAND gates 221, 222, 223, and 224 and one NOR gate 225, which are connected with each other as shown in FIG. 3. In a circuit operation, assuming that all outputs of the NAND gates 221, 222, 223, and 224 go to a low level. When a short pulse signal nSP and a reset signal RESET are on high level and a set signal has a high-to-low transition (i.e., in a first high-to-low transition of a signal $\overline{WE}$ after a read/write operation command), an address input period signal nADD_IN transitions from high to low. It means an external address can be latched in a memory device. As a set signal SET transitions from low to high, the outputs of the NAND gates 222 and 223 go to a high level and the address input period signal nADD_IN goes to a high level again.

Figure 4A:
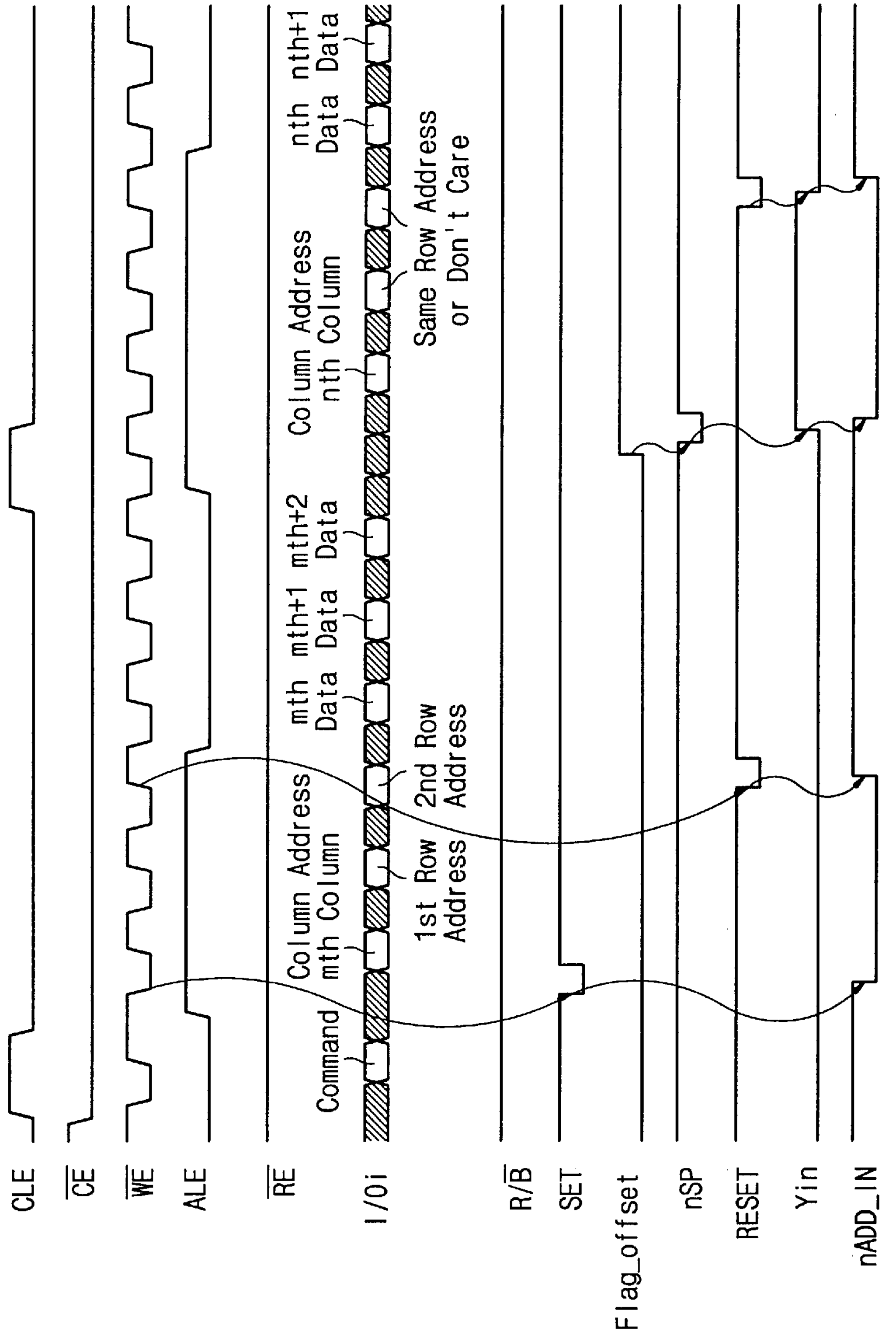
FIG. 4A is a timing view for explaining a data input operation of a nonvolatile semiconductor memory device according to the first embodiment of the present invention.

FIG. 4A illustrates a timing chart for explaining a data input operation of an NAND-type flash memory device according to the first embodiment of the present invention. If receiving a successive data input operation command before a program operation of a memory cell, a command register 190 enables an operation mode flag signal Flag_mode for a successive data input operation. Thereafter, column and row addresses for addressing the memory cell are successively inputted to the memory device through the first input/output pins I/Oi (i=0–7) 250. The inputted column and row addresses are stored in a column address register 140 and a row address register 120 through an address buffer circuit 110 under the control of a control logic 200, respectively. The control logic 200 is prepared to store input data in a page buffer circuit 160 by generating internal signals for the data input operation. This will be explained more fully hereinafter.

As shown in FIG. 4A, if logic states of the external control signals CLE, ALE, and $\overline{RE}$ match an address input condition, a detection circuit 230 outputs a set signal SET having a high-to-low transition in response to a first high-to-low transition of an external control signal $\overline{WE}$. And, an address input period signal nADD_IN transitions from high to low based upon the high-to-low transition of the set signal. In response to the transition of the nADD_IN, the control logic 200 generates an address input control signal CNT1 and an address latch control signal CNT2. In response to the CNT1, the address buffer circuit 110 receives column and row addresses successively inputted through the input/output pins I/Oi 250 from an exterior, which are stored in the column address register 140 and the row address register 120, respectively. A detection circuit 230 outputs a reset signal RESET having a high-to-low transition in response to a third low-to-high transition of the $\overline{WE}$. The nADD_IN goes to high based upon a high-to-low transition of the RESET. That is, the address input is finished.

Synchronized with a low-to-high transition of the data input signal $\overline{WE}$, data is inputted from the second input/output pins 260 through an input/output buffer circuit 180, and a column address of the column address register 140 is sequentially changed or increased. In other words, the data sequentially inputted from the second input/output pins 260 according to an input/output structure is stored in the page buffer circuit 160. When a column address offset change command is inputted during the data input operation, the command register 190 enables a flag signal Flag_offset for changing a column address offset in response to the command. A next column address of the inputted column addresses is transferred to the column address register 140 through the address buffer circuit 110. In response to the external control signals CLE, ALE, $\overline{RE}$, and $\overline{WE}$, the detection circuit 230 detects an address input period endpoint to generate a reset signal RESET of active low pulse. That is, in response to the third low-to-high transition of the $\overline{WE}$, the detection circuit 230 outputs the reset signal RESET. And, the nADD_IN is disabled with high level, i.e., an address input operation for changing a column address offset is finished.

Synchronized with a low-to-high transition of the data input signal $\overline{WE}$, remaining data is sequentially stored in a latch group of the page buffer circuit 160 corresponding to the column address newly inputted through the column gate circuit 170. The remaining data is inputted from the second input/output pins 180 to the input/output buffer circuit 180 before the changing the column address, but remains in the input/output buffer circuit 180. When the data input operation is finished, the data temporarily stored in the latch group of the page buffer circuit 160 is programmed in the memory cell arrays 100. The memory cell array 100 corresponds to a page selected by a program command.

Figure 4B:
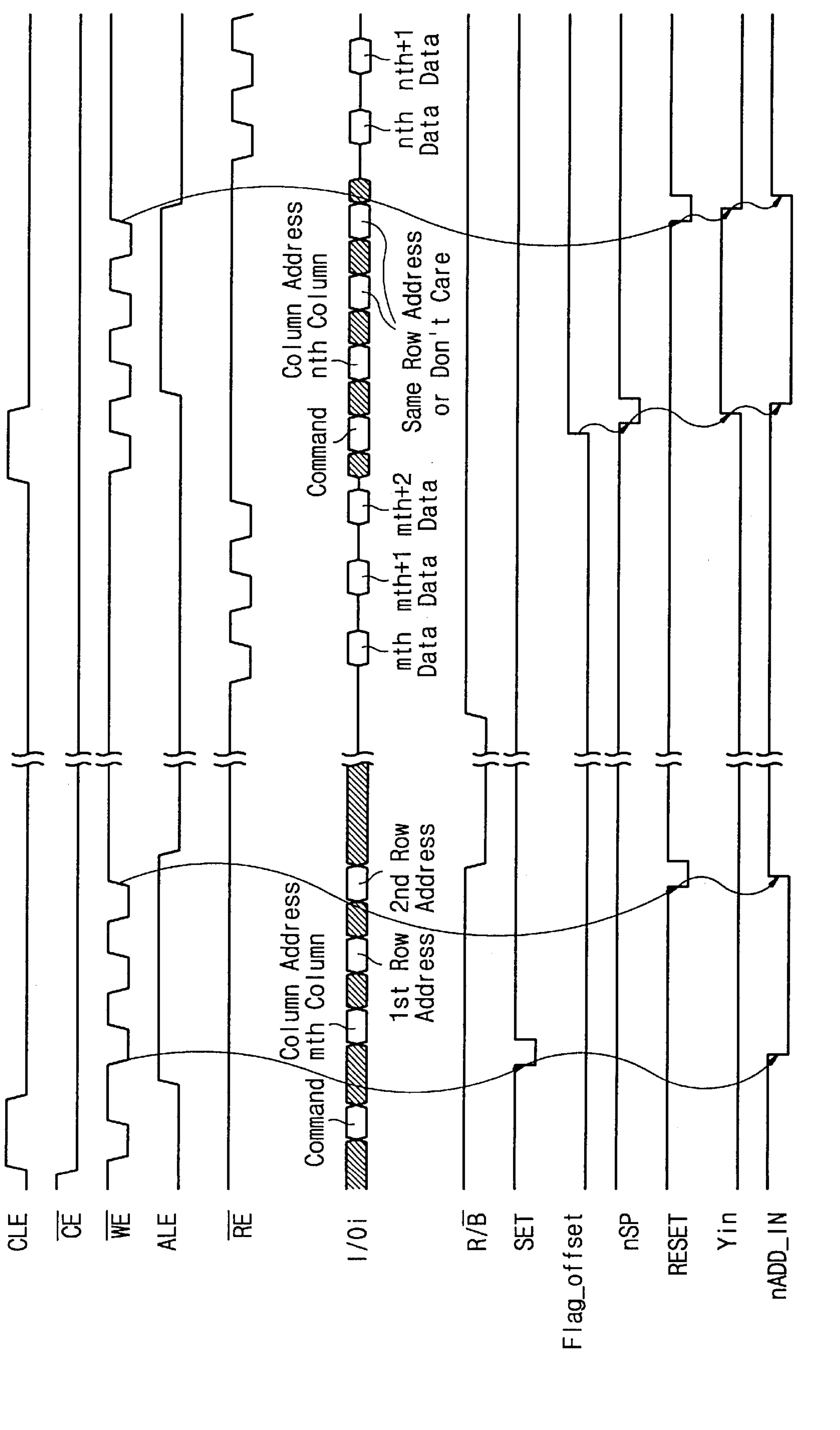
FIG. 4B is a timing view for explaining a data output operation of a nonvolatile semiconductor memory device according to the first embodiment of the present invention.

FIG. 4B illustrates a timing chart for explaining a data output operation of an NAND-type flash memory device according to the first embodiment of the present invention. When a read operation command, the command register 190 enables an operation mode flag signal Flag_mode indicating a read operation. Thereafter, column and row address data for addressing the memory cell arrays 100 are successively inputted through the first input/output pins I/Oi 250. The inputted column and row address data are stored a column address register 140 and a row address register 120 through an address buffer circuit 110 under the control of a control logic 200, respectively. An address input operation is the same to that of the write operation, as described in FIG. 4A, so that description thereof will be skipped herein. The control logic 200 generates internal signals for a read operation to control a page buffer circuit 160. That is, the page buffer circuit 160 senses data of a memory cell, and temporarily stores the sensed data in the page buffer circuit 160. The memory cell corresponds to a page of a latch group of selected by a column gate circuit 170. During the sensing operation, the NAND-type flash memory device retains BUSY state, i.e., an R/$\overline{B}$ signal retains low level indicating BUSY state.

After sensing and storing the data of the memory cells, the state of the NAND-type flash memory device becomes BUSY to READY. Thereby, the memory device outputs the data temporarily stored in the page buffer circuit 1601 to the exterior. When the NAND-type flash memory device enters READY state from BUSY state, the column address register 140 sequentially increases a column address with the high-to-low transition of the $\overline{RE}$. And, a column decoder 150 and a column gate circuit 170 select a latch group of the page buffer circuit 160 in response to a column address sequentially outputted from the column address register 140. The data stored in the selected group is outputted to exterior through an input/output buffer circuit 180.

When receiving a column address offset change command during the data output operation, a command register 190 enables a flag signal Flag_offset for changing a column address offset in response to the command. And then, a column address next-inputted to the address buffer circuit 10 is stored in the column address register 140. This will be explained more fully hereinafter.

When the column address offset change command is applied to the first input/output pins I/Oi 250 based upon a command input condition (CLE='H', ALE='L, $\overline{RE}$='H', and $\overline{WE}$='L-H'), the command register 190 causes a low-to-high transition of the Flag_offset. A short pulse generation circuit 210 generates a short pulse signal nSP in response to the low-to-high transition of the Flag_offset. The nADD_IN is enabled from high to low with the nSP. The control logic 200 generates an address input control signal CNT1 and an address latch control signal CNT2 in response to activation of the nADD_IN, thereby transferring the address next inputted to the first input/output pins 250 to the column address register 140 through the address buffer circuit 110. Then, a detection circuit 230 detects an endpoint of an address input period (i.e., a low-to-high transition of a signal $\overline{WE}$) in response to external control signals CLE, ALE, $\overline{RE}$, and $\overline{WE}$ to output a reset signal RESET. And, the nADD_IN is disabled with high level, i.e., the address input operation for changing a column address offset is finished.

Synchronized with a high-to-low transition of the $\overline{RE}$, a column address is continuously changed. According to the change of the column address, data remained in a newly selected page buffer circuit is sequentially outputted to the exterior of the memory device through a data input/output buffer circuit 180. The selected page buffer circuit corresponds to the changed column address newly inputted through a column gate circuit 170.

Figure 5:
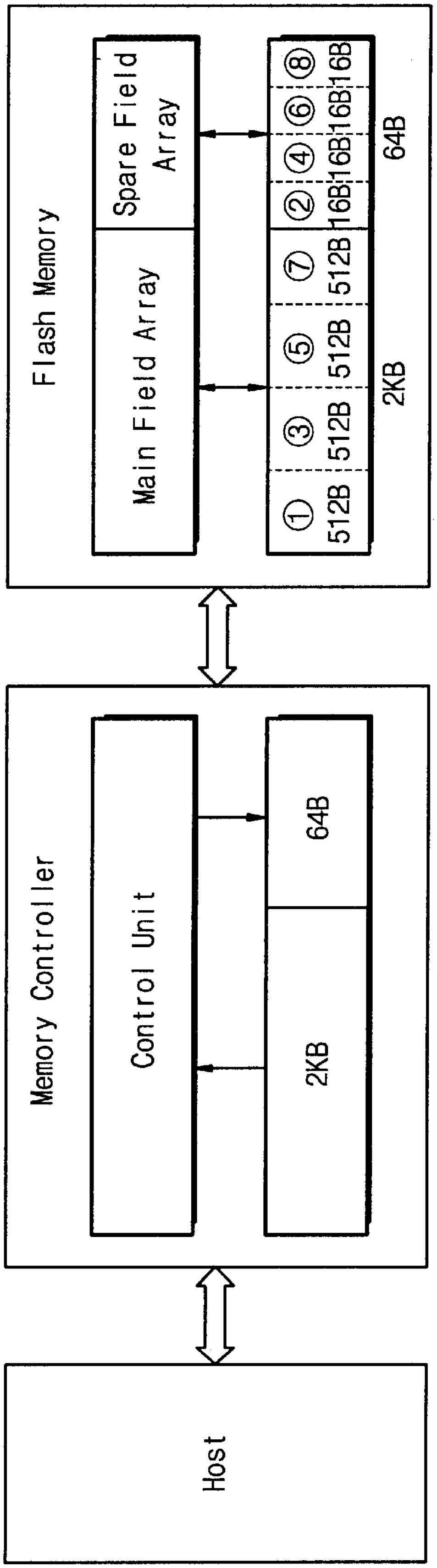
FIG. 5 is a block diagram showing a memory application system with a nonvolatile semiconductor memory device according to the first embodiment of the present invention.

The NAND-type flash memory device according to the first embodiment uses an externally provided column address in a data input/output operation as an internal column address. By such a function, the NAND-type flash memory device can be applied to all memory systems as a memory interface irrespective of a buffer memory size of a memory controller, although a page size of the memory device increases, for example, from "512 B+16 B" to "2 KB+64 B". FIG. 5 shows such a flash memory device. Although the buffer memory size is, for example, "512 B+16 B", normal data of 512 B is allocated to a gate buffer area ① of 2 KB corresponding to a main field array by a write command, as shown in FIG. 5. And, additional data of 16 B is allocated to a page buffer area ② of 64 B corresponding to a spare filed array by a column address offset change command. Likewise, according to the next transferred column address, normal data of 512 B is allocated to a page buffer area ③ of 2 KB by a write command, and additional data of 16 B is allocated to a page buffer circuit area of 64 B by a column address offset change command. With such a manner, data is normally stored in the page buffer circuit 160. Therefore, the page size of the NAND-type flash memory device can be extended irrespective of a memory system. Thus, the first embodiment of the present invention achieves a high-speed read/write operation of the NAND-type flash memory device.

Figure 6:
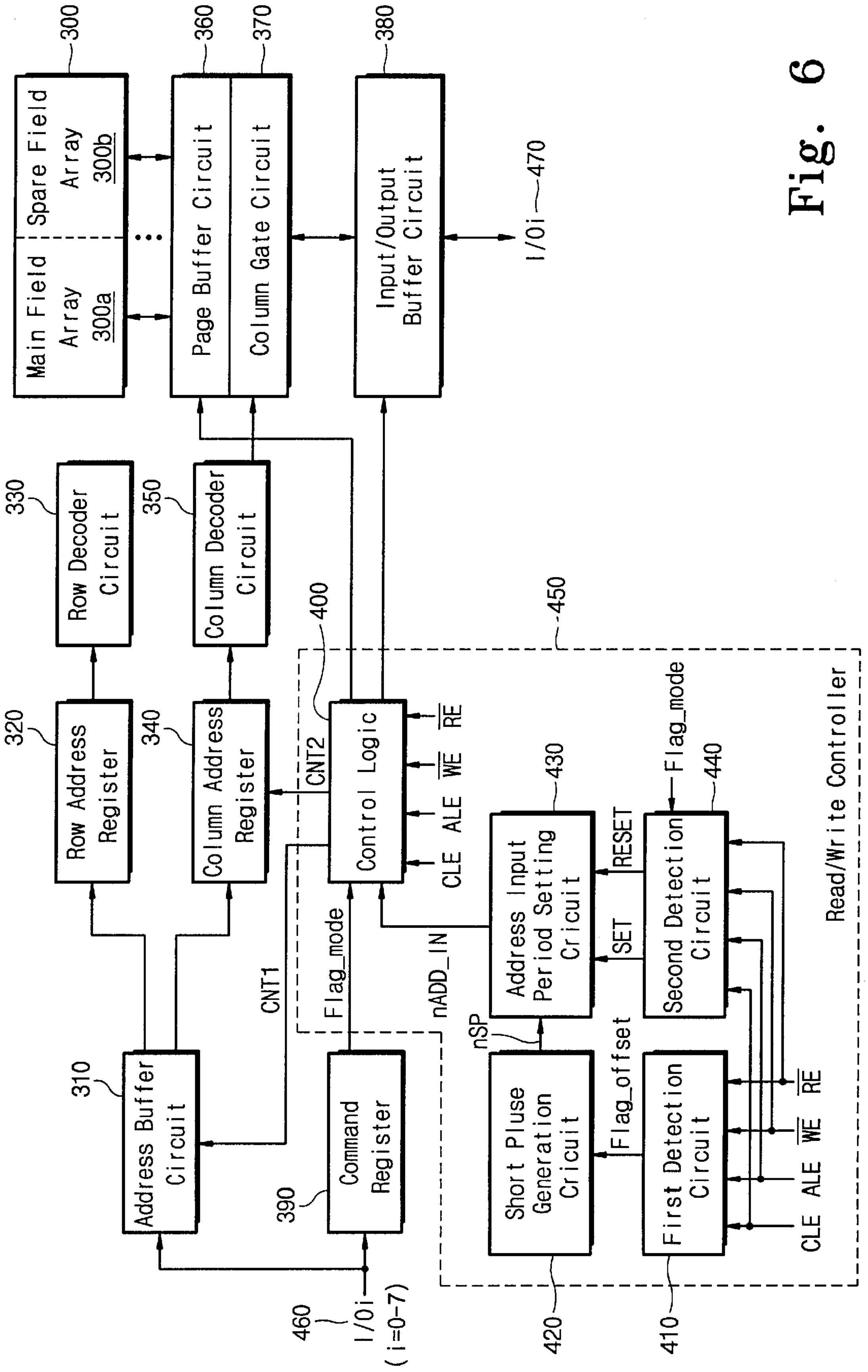
FIG. 6 is a block diagram showing a nonvolatile semiconductor memory device according to a second embodiment of the present invention.

FIG. 6 schematically illustrates an NAND-type flash memory device according to a second embodiment of the present invention. The NAND-type flash memory device changes a column address offset by using a combination of external control signals CLE, ALE, $\overline{WE}$, and $\overline{RE}$ instead of a column address offset change command. Components 300–380 in the second embodiment have the same functions as those in the first embodiment, so that description thereof will be skipped herein.

Referring to FIG. 6, when a read operation or a successive data input operation command is applied to input/output pins I/Oi (i=0–7) 460, a command register 390 enables a flag signal Flag_mode of an operation mode by the command. A control logic 400 generates internal signals for a read/write operation in response to the Flag_mode. The memory device further includes a first detection circuit 410, a short pulse generating circuit 420, an address input period setting circuit 430, and a second detection circuit 440. In this embodiment, the control logic 400, the first detection circuit 410, the short pulse generation circuit 420, the address input period setting circuit 430, the second detection circuit 440 constitute a read/write controller 450 that carries out a general control operation based upon a read/write operation.

The first detection circuit 410 receives the external control signals CLE, ALE, $\overline{RE}$, and $\overline{WE}$ provided from the exterior (e.g., memory controller), and detects whether a specific combination of the inputted signals match a value indicating a column address offset change. When the specific signal combination indicates the column address offset change, the first detection circuit 410 generates a flag signal Flag_offset that indicates the column address offset change. For example, when the CLE, ALE, $\overline{RE}$, and $\overline{WE}$ are on high level, the first detection circuit 410 outputs a flag signal Flag_mode of a low-to-high transition. The short pulse generation circuit 420 generates a short pulse signal nSP in response to the flag signal Flag_offset. The address input period setting circuit 430 enables an address input period signal nADD_IN in response to the short pulse signal nSP. When the nADD_IN is enabled, the control logic 400 generates an address input control signal CNT1 and an address latch control signal CNT2. The address buffer circuit 310 stores address data provided to the first input/output pins I/Oi 460 in response to the CNT1. The column address register 340 latches an output of the address buffer circuit 310 in response to the CNT2. That is, the column address of the column address register 340 is updated by a new column address outputted from the address buffer circuit 310. The nADD_IN is disabled by a reset signal RESET outputted from the second detection circuit 440.

Similar to the first embodiment, the second detection circuit 440 enables a set signal SET only when a read operation command or a successive data input operation command is inputted. As the SET is enabled, an address input period signal nADD_IN outputted from the address input period setting circuit 430 is enabled. That is, when a read operation or a successive data input operation command, the nADD_IN is enabled by the SET outputted from the second detection circuit 440. The enabled nADD_IN is disabled at an endpoint of an address input period by a reset signal RESET outputted from the second detection circuit 440. In the second embodiment, it will be understood to those skilled in the art that the short pulse generation circuit 420 and the address input period setting circuit 430 have the same construction as in the first embodiment.

The command register 390 and the read/write controller 450 constitute means for controlling an address buffer circuit and a column address register, so that an external address provided to the first input/output pins 460 is stored in a column address register 340 during data input/output operation of the memory device.

Figure 7:
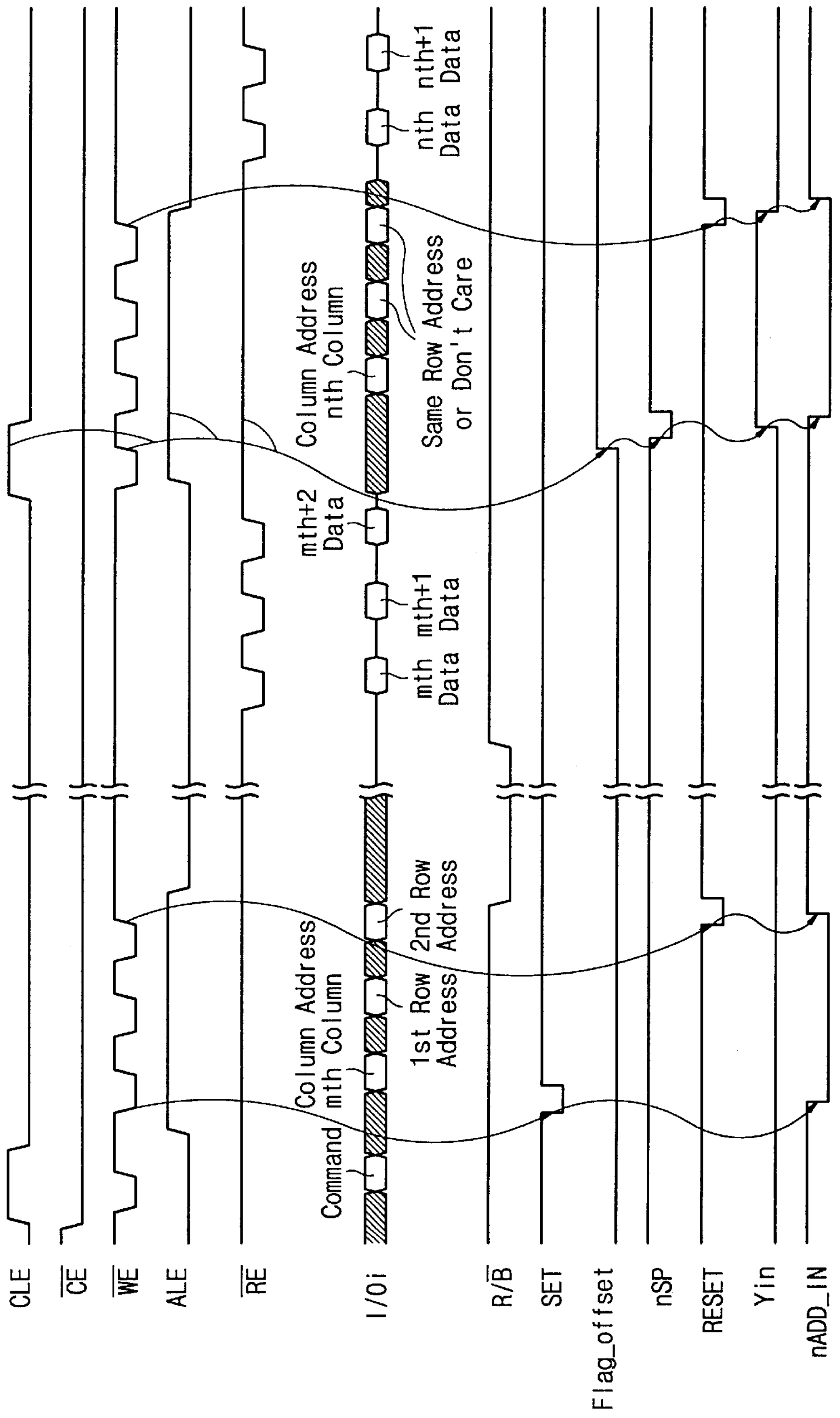
FIG. 7 is a timing view for explaining a data output operation of a nonvolatile semiconductor memory device according to the second embodiment of the present invention.

FIG. 7 illustrates a timing chart for explaining a data input operation of an NAND-type flash memory device according to the second embodiment of the present invention. When receiving a data input operation command before a program operation, a command register 390 enables an operation mode flag signal Flag_mode indicating a successive data input operation. Thereafter, column and row address data for addressing memory cell arrays 300 are successively inputted through the first input/output pins I/Oi 460. The successively inputted column and row address are stored in a column address register 340 and a row address register 320 through an address buffer circuit 310 under control of a control logic 400, respectively. The control logic 400 is prepared to store data to be directly inputted in a page buffer circuit 360 by generating internal signals for a data input operation. This will be described more fully hereinafter.

As shown in FIG. 7, when logic states of external control signals CLE, ALE, and $\overline{RE}$ match an address input condition, a second detection circuit 440 outputs a set signal SET having a high-to-low transition in response to a first high-to-low transition of an external control signal $\overline{WE}$. And, an address input period signal nADD_IN transitions from high to low with a high-to-low transition of the SET. The control logic 400 generates an address input control signal CNT1 and an address latch control signal CNT2 in response to a transition of the nADD_IN. An address buffer circuit 310 receives successively inputted column and row address from the first input/output pins 460 in response to the CNT1. The inputted column and row address are stored in a column address 340 and a row address register 320 according to the CNT2, respectively. The second detection circuit 440 outputs a reset signal RESET having a high-to-low transition in response to a third low-to-high transition of the $\overline{WE}$. The nADD_IN goes to high with a high-to-low transition of the RESET.

Synchronized with a low-to-high transition of the data input signal $\overline{WE}$, data is inputted through an input/output buffer circuit 380 to the memory cell array 300 and a column address of the column address register 340 is sequentially changed (or increased). That is, the data inputted with an input/output structure is temporarily stored in a page buffer circuit 360. When the combination of the CLE, ALE, $\overline{RE}$, and $\overline{WE}$ matches a column address offset change condition during the data input operation, as shown in FIG. 7, a first detection circuit 410 enables a flag signal Flag_offset for changing a column address offset based upon the combination of the CLE, ALE, $\overline{RE}$, and $\overline{WE}$. A column address next inputted from the first input/output pins 460 is stored in the column address register 340 through the address buffer circuit 310. This will be explained more fully hereinafter.

When external control signals CLE, ALE, $\overline{RE}$, and $\overline{WE}$ having the combination for changing the column address offset is applied to the first detection circuit 410, the first detection circuit 410 outputs an offset change flag signal Flag_offset having a low-to-high transition. The short pulse generation circuit 420 generates a short pulse signal nSP in response to the low-to-high transition of the Flag_offset. According the generation of the nSP, the nADD_IN is enabled from high to low. The control logic 400 generates an address input control signal CNT1 and an address latch control signal CNT2 in response to activation of the nADD_N, thereby transfers the next inputted column address to the column address register 340 through the address buffer circuit 310. Thereafter, the second detection circuit 440 detects an endpoint of an address input period to generate a rest signal RESET of active low pulse. In other words, the second detection circuit 440 outputs a reset signal RESET in response to a third low-to-high transition of the $\overline{WE}$ and the address input period signal nADD_IN is disabled with high level. That is, the column address of the column address register 340 is turned (updated) into a new column address.

Synchronized with a low-to-high transition of the $\overline{WE}$ remaining data is inputted to the page buffer circuit 360 through the input/output buffer circuit 380. The remaining data is sequentially stored in a selected latch group of the page buffer circuit 360, in which the selected latch group corresponds to the newly inputted column address through a column gate circuit 370. When a data input operation is finished, the data temporarily stored in a page buffer circuit 360 is programmed in a memory cell correspond to a page selected by a program command.

Figure 8:
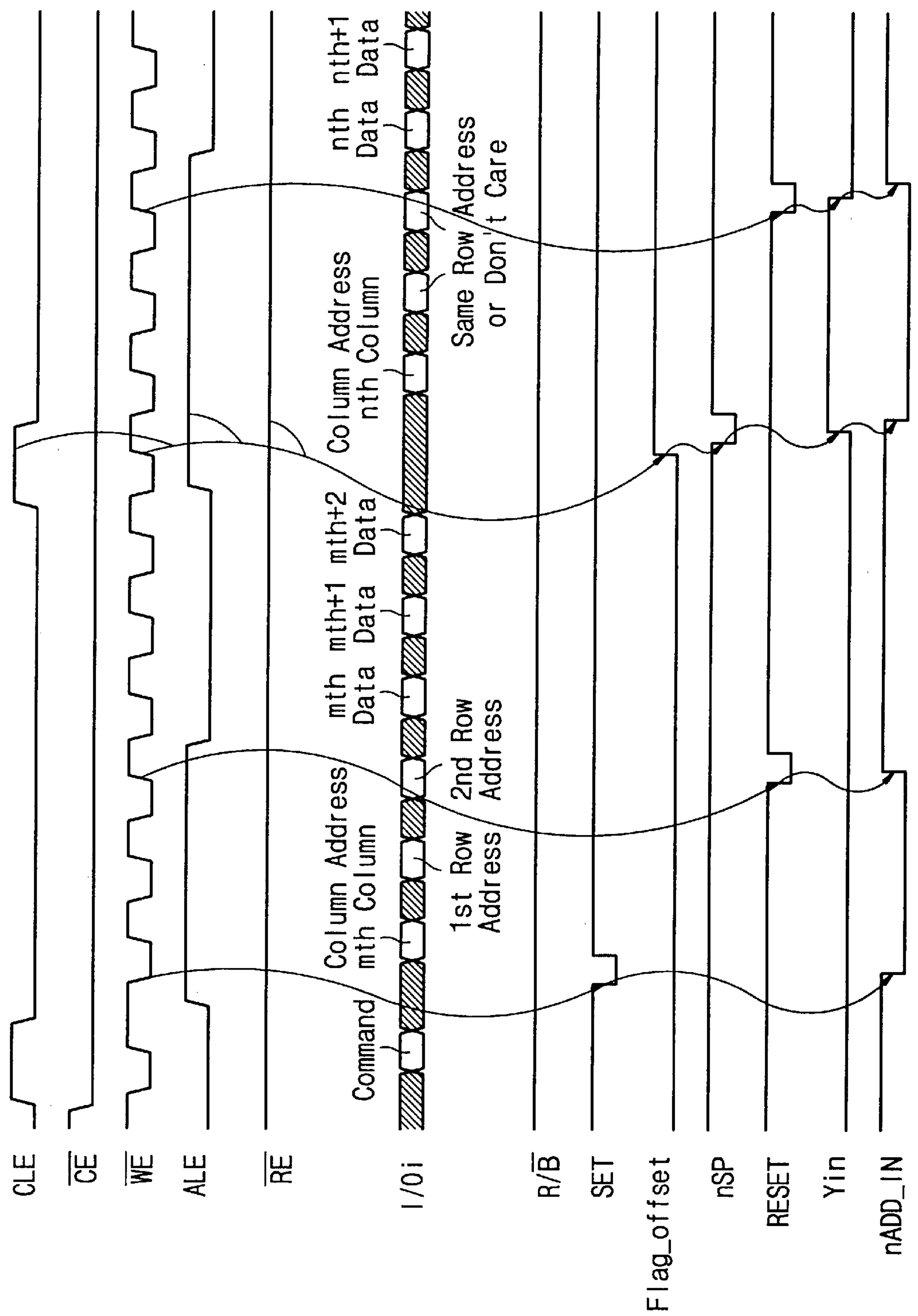
FIG. 8 is a timing view for explaining a data input operation of a nonvolatile semiconductor memory device according to the second embodiment of the present invention.

FIG. 8 illustrates a timing chart for explaining a data output operation of the NAND-type flash memory device according to the second embodiment of the present invention. When receiving a read operation command, a command register 190 enables an operation mode flag signal Flag_mode indicating a read operation. Thereafter, column and row addresses for addressing memory cells are successively inputted through the first input/output pins I/Oi 460. The inputted column and row addresses are stored in a column address register 340 and a row address register 320 through an address buffer circuit 310 under the control of a control logic 400, respectively. An operation associated with address input is the same as described in FIG. 7, so that description thereof will be skipped herein. The control logic 400 generates internal signals for a read operation to control a page buffer circuit 360. That is, the page buffer circuit 360 senses data of the memory cell array of the selected page, and temporarily stores the sensed data in a page buffer circuit 360. The NAND-type flash memory device retains BUSY state during the sensing operation. That is, an R/$\overline{B}$ signal retains low level indicating BUSY state during the sensing operation.

When the sensed data of the memory cell is stored in the page buffer circuit 360, the NAND-type flash memory device enters STANDBY state from BUSY state to output the temporarily stored data of the memory cell to exterior of the memory device. When the NAND-type flash memory device is from BUSY state to STANDBY state, the column address register 340 sequentially increases column addresses with a high-to-low transition of the data output signal $\overline{RE}$. And, the column decoder circuit 350 and the column gate circuit 370 select a latch group in the page buffer circuit 360 in response to the column addresses sequentially outputted from the column address register 340. The data stored in the selected latch group of the page buffer circuit 360 is outputted to exterior of the memory device through the input/output buffer circuit 380.

When a combination of the external control signals CLE, ALE, $\overline{RE}$, and $\overline{WE}$ matches a column address offset change condition (e.g., CLE='H', ALE='H', $\overline{RE}$='H', and $\overline{WE}$='H'), as shown in FIG. 8, a first detection circuit 410 enables a flag signal Flag_offset for a column address offset change in response to a combination of external control signals. A next-directly inputted column address is stored in the column address register 340 through the address buffer circuit 310, as mentioned above. With a high-to-low transition of the data output signal $\overline{RE}$, remaining data is outputted to exterior of the memory device. The remaining data is sequentially outputted from a select latch group of the page buffer circuit 360. The select latch group corresponds to a column address newly inputted through a column gate circuit 370.

It will be understood that the second embodiment has the same efficiency as the first embodiment. That is, a page size of the NAND-type flash memory device can be increased irrespective of a memory system. As a result, a high-speed read/write operation of the NAND-type flash memory device can be achieved.

Figure 9:
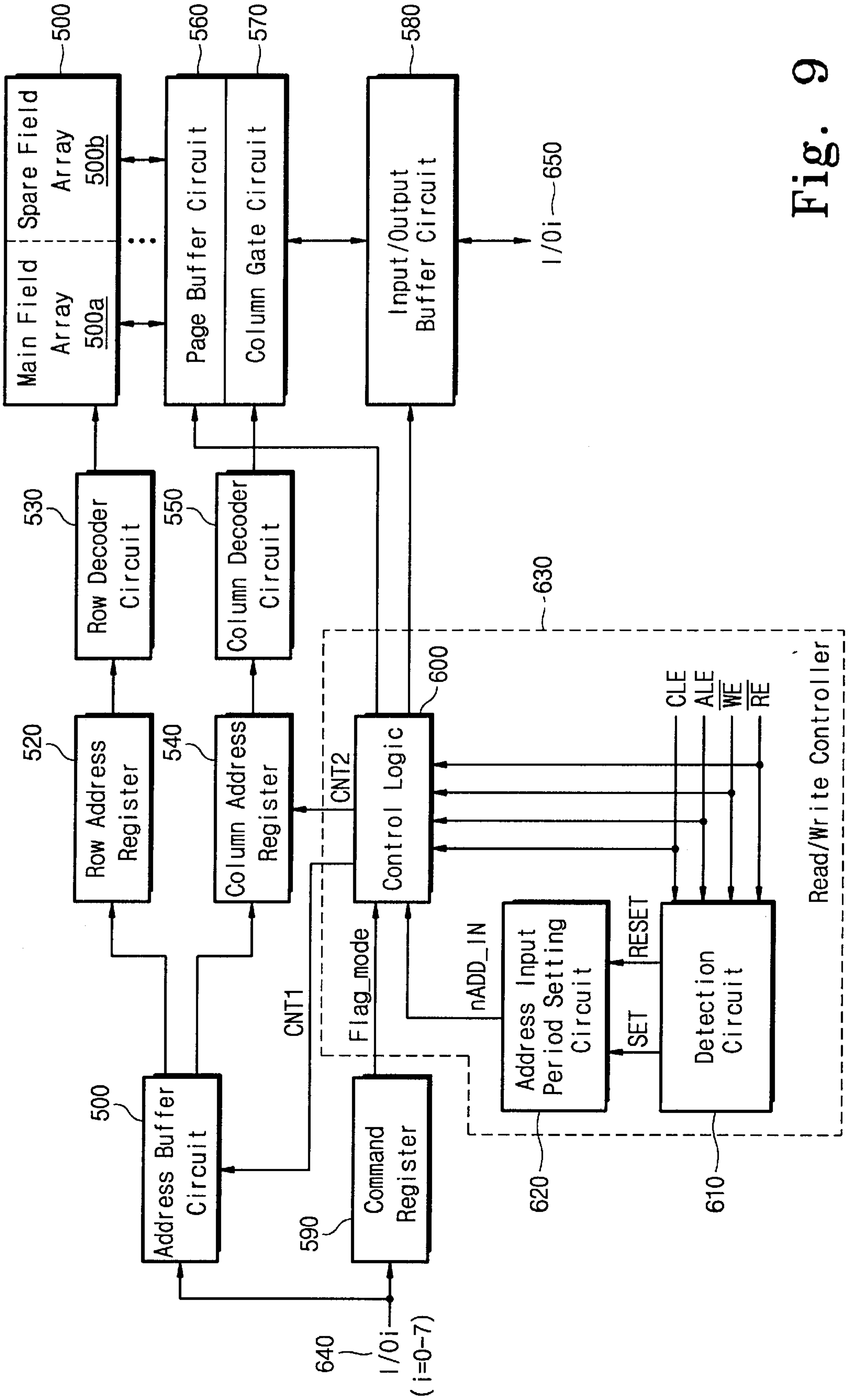
FIG. 9 is a block diagram showing a nonvolatile semiconductor memory device according to a third embodiment of the present invention.

FIG. 9 schematically illustrates an NAND-type flash memory device according to a third embodiment of the present invention. In the NAND-type flash memory device, the content of a column address register 540 is updated by a column address provided from exterior (e.g., memory controller) whenever an address input condition is made. Components 500–580 of the third embodiment are identical to those of the first and second embodiments, so that their description will be skipped herein.

Referring now to FIG. 9, a command register 590 enables a flag signal Flag_mode of operation mode when a read operation command or a successive data input operation command is applied to a first input/output pins I/Oi 640. A control logic 600 generates internal signals for read/write operation in response to the Flag_mode. The NAND-type flash memory device further includes a detection circuit 610 and an address input period setting circuit 620. The control logic 600, the detection circuit 610, and the address input period setting circuit 620 constitute a read/write controller 630.

Figure 10:
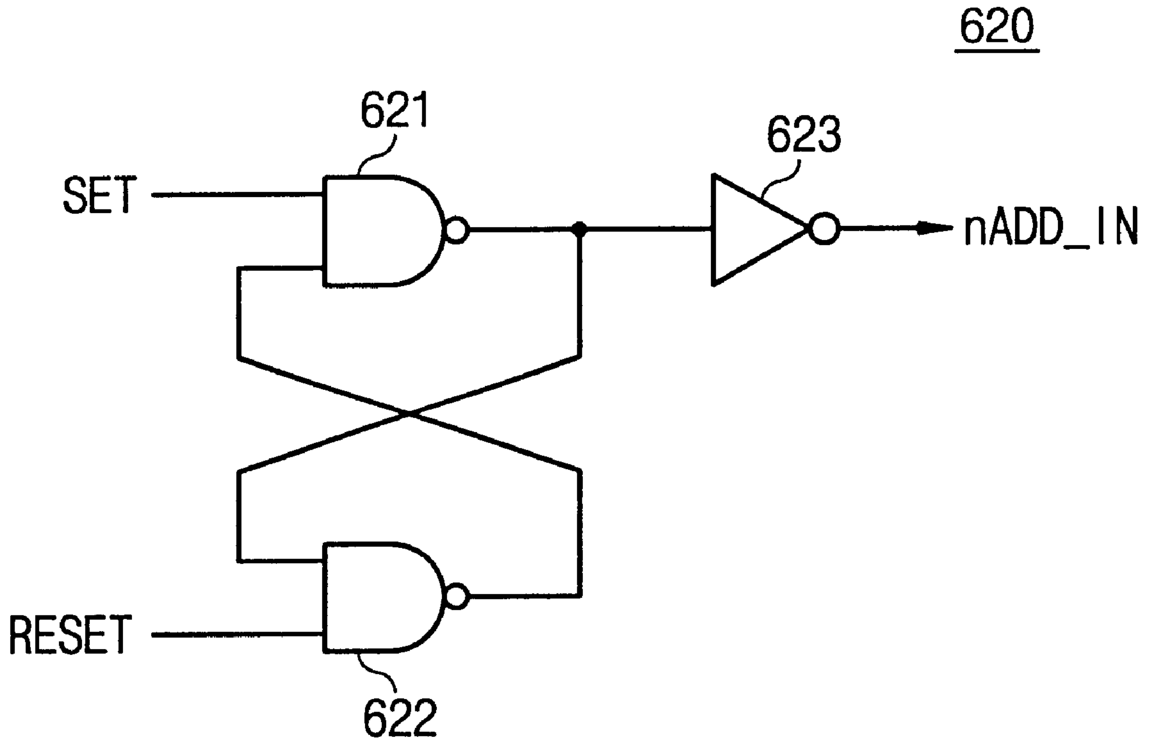
FIG. 10 is a diagram illustrating a preferred embodiment of an address input, period setting circuit shown in FIG. 9.

The detection circuit 610 generates a set signal SET and a reset signal RESET in response to external control signals CLE, ALE, $\overline{WE}$, and $\overline{RE}$. For example, the SET is enabled with a first high-to-low transition of the $\overline{WE}$ when the CLE, ALE, and $\overline{RE}$ are high. The RESET is enabled with a low-to-high transition (e.g., third low-to-high transition) of $\overline{WE}$ when the CLE, ALE, and $\overline{RE}$ are high. The detection circuit 610 can be realized so that the reset signal RESET is enabled in synchronized with a first or a second low-to-high transition of the $\overline{WE}$ when the external control signals ALE, CLE, and $\overline{RE}$ are high. The address input period setting circuit 620 enables an address input period signal nADD_IN in response to the SET, and disables the enabled nADD_IN in response to the RESET. The address input period setting circuit 620 may be constructed using two NAND gates 621 and 622 and one inverter 623, as shown in FIG. 10.

In this embodiment, the command register 590 and the read/write controller 630 constitutes means for controlling an address buffer circuit and a column address register so that when an external address is applied to the first input/output pins 640 during data input/output operation of the memory cell, the applied external address may be stored in a column address register 540.

Figure 11:
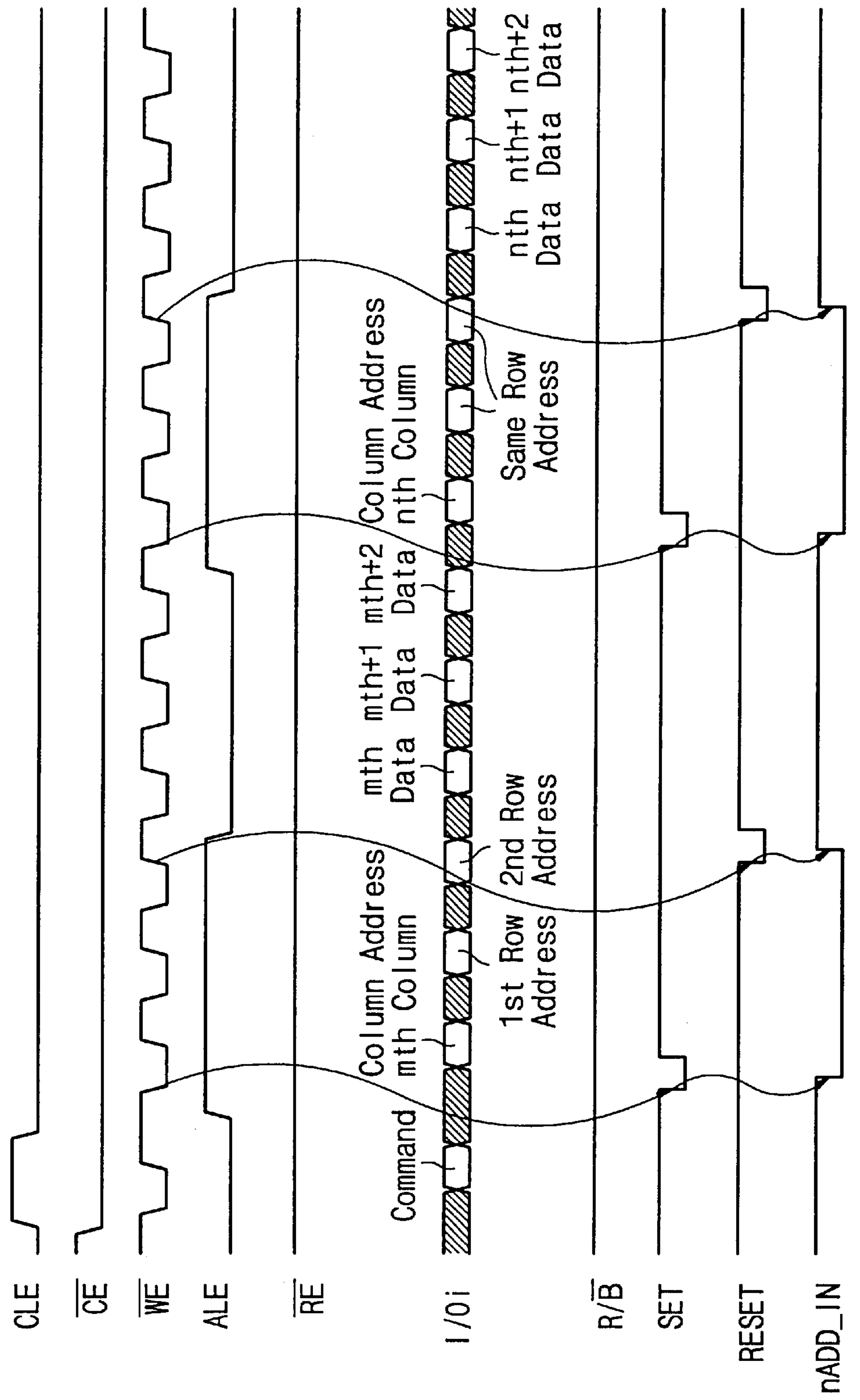
FIG. 11 is a timing view for explaining a data input operation of a nonvolatile semiconductor memory device according to the third embodiment of the present invention.

FIG. 11 illustrates a timing chart for explaining a data input operation of an NAND-type flash memory device according to the third embodiment of the present invention. When receiving a successive data input operation command, before a programming operation of a memory cell, a command register 590 enables an operation mode flag signal Flag_mode indicating a successive data input operation. Thereafter, column and row address data for addressing the memory cell are successively inputted through the first input/output pins I/Oi 640. The successively inputted column and row addresses are stored in a column address register 540 and a row address register 520 through an address buffer circuit 510 under the control of a control logic 600, respectively. The control logic 600 is prepared to store directly inputted data in a page buffer circuit 560 by generating internal signals for data input operation. This will be described more fully hereinafter.

As shown in FIG. 11, when logic states of external control signals CLE, ALE, and $\overline{RE}$ match an address input condition, a detection circuit 610 outputs a set signal SET having a high-to-low transition in response to a first high-to-low transition of $\overline{WE}$. And, an address input period signal nADD_IN transitions from high to low with a high-to-low transition of the SET. The control logic 600 generates an address input control signal CNT1 and an address latch control signal CNT2 in response to the transition of the nADD_IN. The address buffer circuit 510 receives successively column and row addresses in response to the CNT1 from the first input/output pins 640. The inputted column and row addresses are stored in the column address register 540 and the row address register 520 according to the CNT2, respectively. The detection circuit 610 outputs a reset signal RESET having a high-to-low transition in response to a third low-to-high transition of an external control signal $\overline{WE}$. The nADD_IN goes to high with the high-to-low transition of the RESET.

Synchronized with the low-to-high transition of the data input signal $\overline{WE}$, data is inputted to the page buffer circuit 560 through the input/output buffer circuit 580 and a column addresses of the column address register 540 are sequentially changed (increased). That is, the data sequentially inputted according to an input/output structure is temporarily stored in the page buffer circuit 560. When the combination of CLE, ALE, $\overline{RE}$, and $\overline{WE}$ matches an address input condition during data input operation, as shown in FIG. 11, the detection circuit 610 enables a set signal SET for column address offset change according to the combination. The next-directly inputted column address is stored in the column address register 540 through the address buffer circuit 510. This will be described more fully hereinafter.

The external control signals CLE, ALE, $\overline{RE}$, and $\overline{WE}$ having the combination for the column address offset change (or indicating the address input condition) are applied to detection circuit 610. The detection signal 610 enables a set signal SET of active low pulse. The address input period signal nADD_IN is enabled from high to low according to the SET. The control logic 600 generates an address input control signal CNT1 and an address latch control signal CNT2 in response to activation of the nADD_IN. Then, a next-directly inputted column address is transferred from the first input/output pins 640 to the column address register 540 through the address buffer circuit 510. The detection circuit 610 outputs a reset signal RESET in response to a third low-to-high transition of the $\overline{WE}$. The nADD_IN is disabled with high level. That is, a column address of a column address register 540 is changed (updated) to a new column address.

Synchronized with a low-to-high transition of the data input signal $\overline{WE}$, remaining data is inputted to the page buffer circuit 560 through an input/output buffer circuit 580. The remaining data is sequentially stored in a selected latch group of the page buffer circuit 560. The selected latch group corresponds to a column address newly inputted through a column gate circuit 570. When the data input operation is finished, the data temporarily stored in the page buffer circuit 560 is programmed to memory cells that corresponds to a page selected by a program command.

Figure 12:
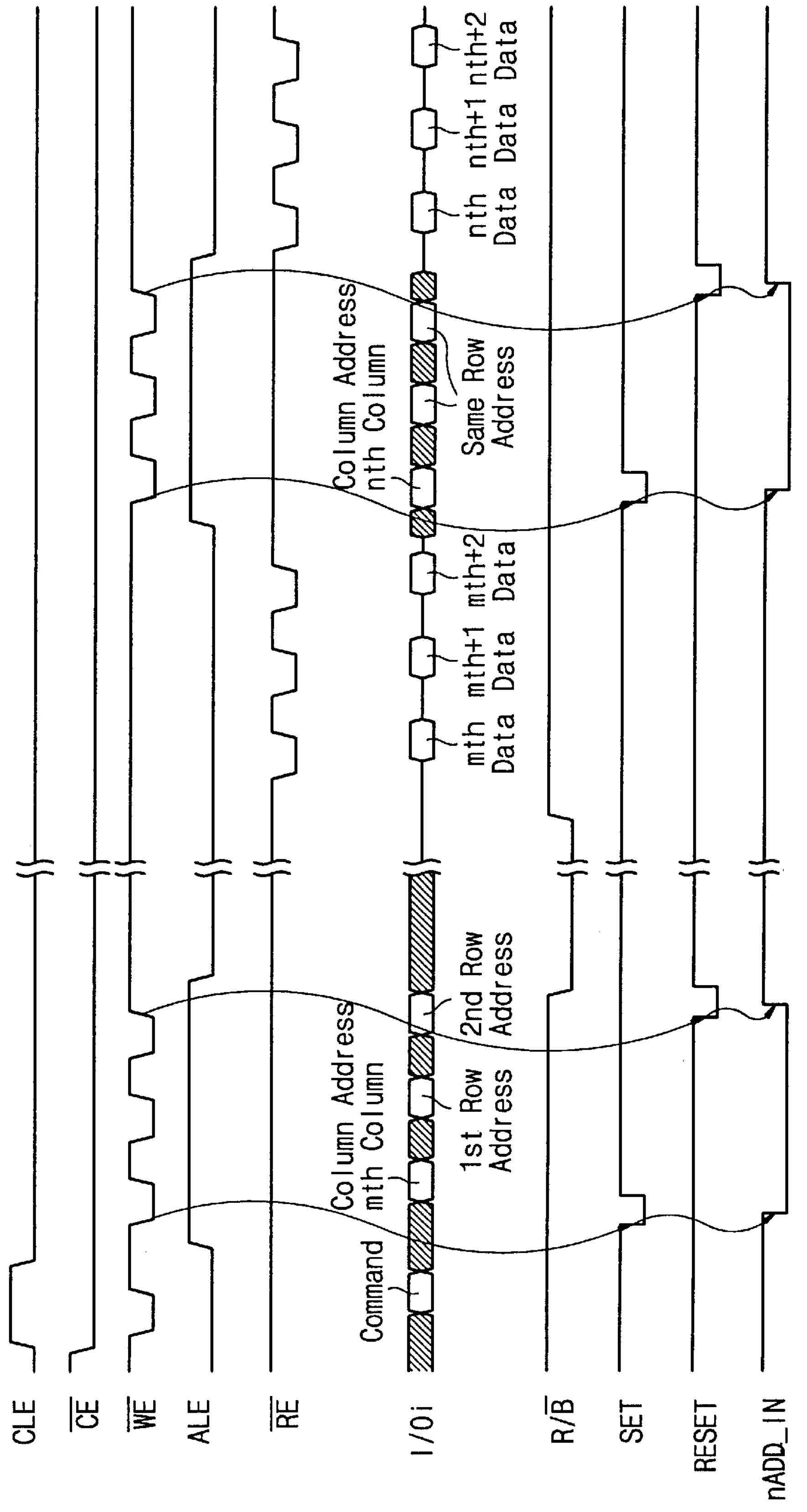
FIG. 12 through FIG. 14 are timing views for explaining a data output operation of a nonvolatile semiconductor memory device according to the third embodiment of the present invention.
Figure 13:
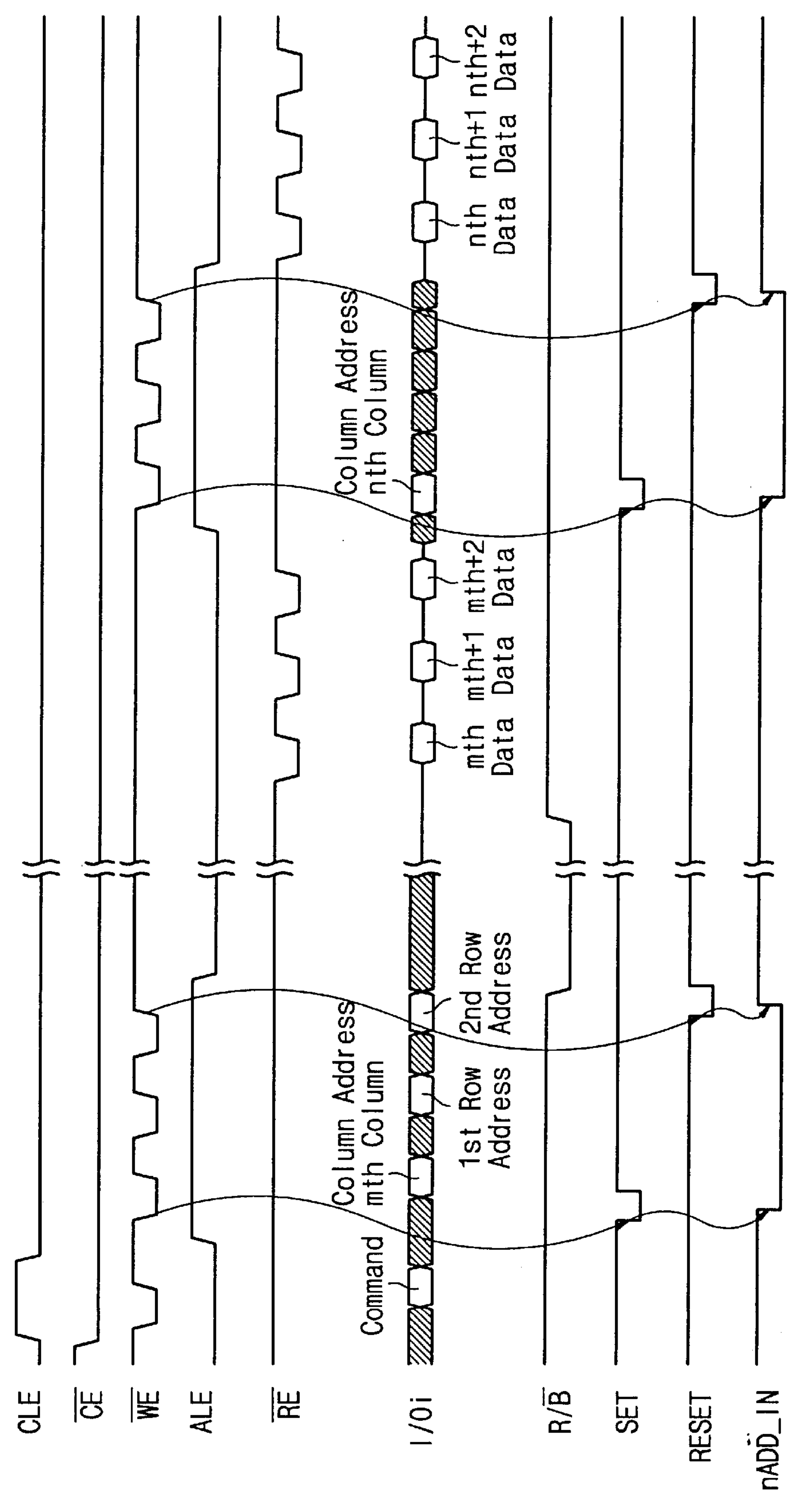
Figure 14:
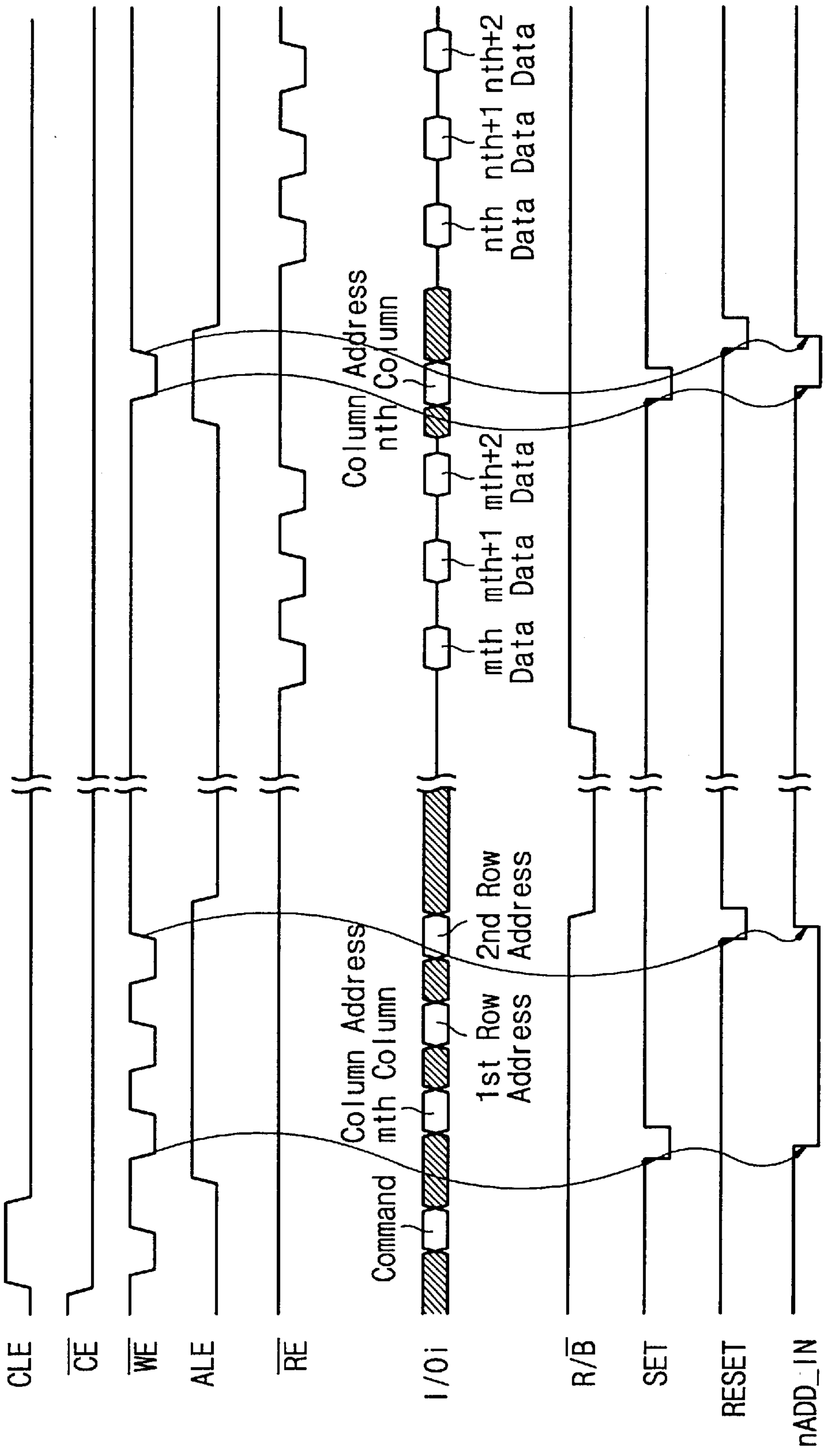
Figure 15:
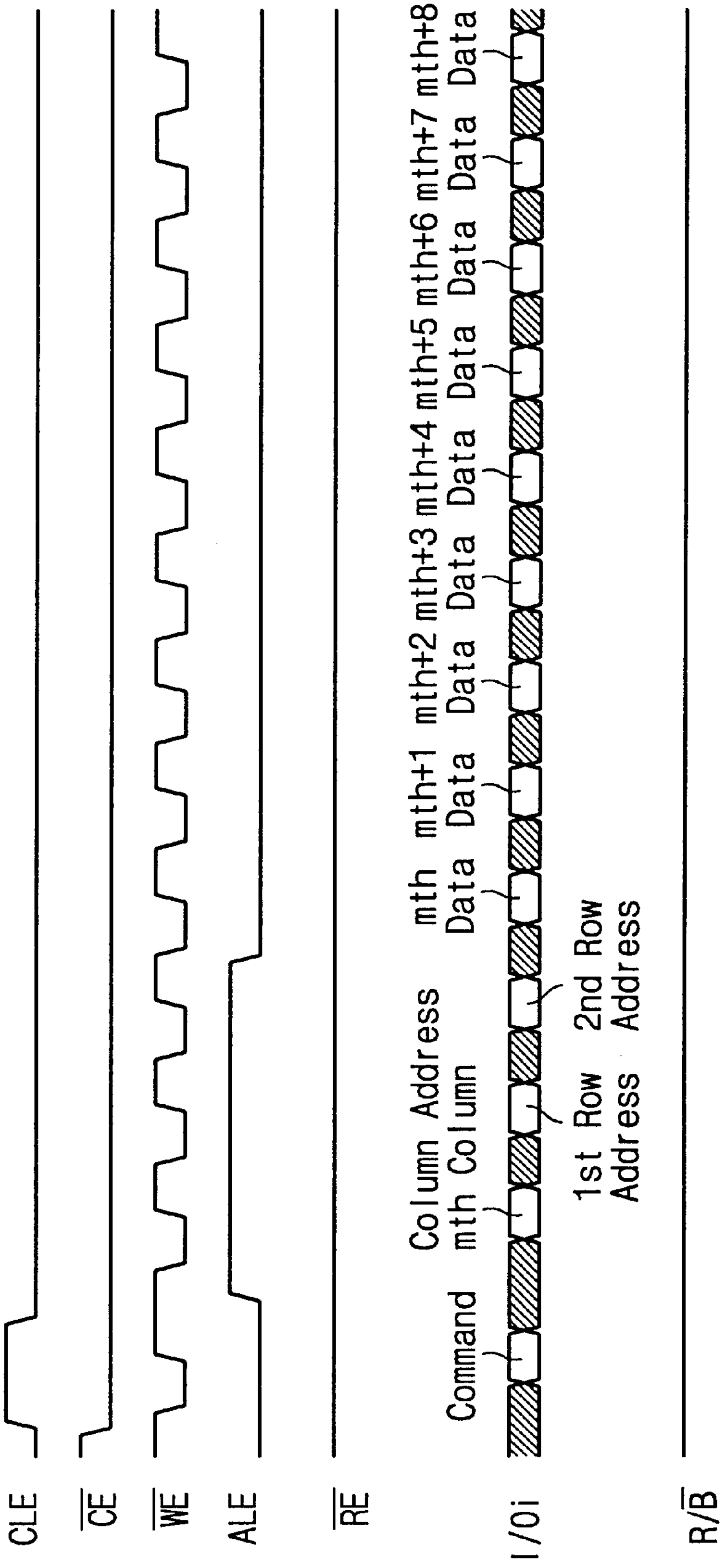
FIG. 15 is a timing view for explaining a data input operation of a conventional flash memory device.
Figure 16:
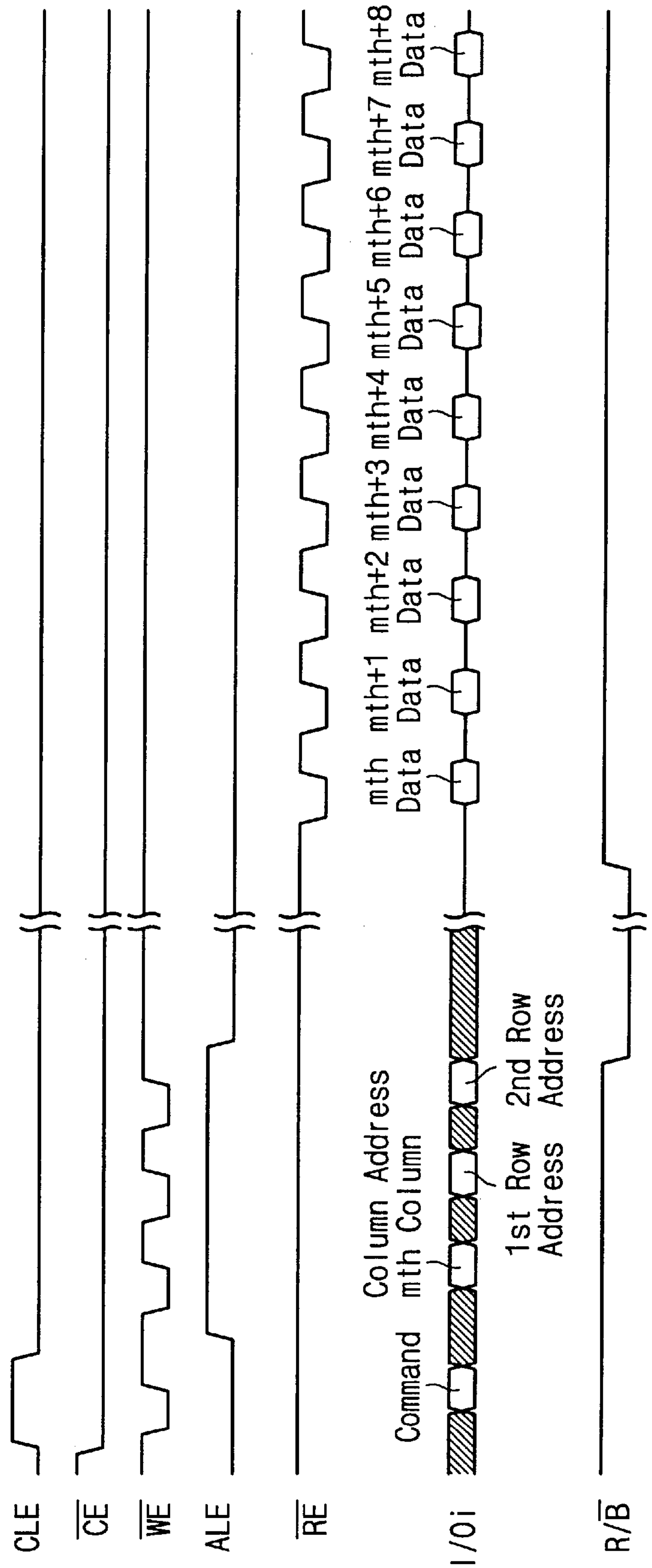
FIG. 16 is a timing view for explaining a data output operation of a conventional flash memory device.

FIG. 12 through FIG. 14 illustrate timing charts for explaining a data output operation of the NAND-type flash memory device according to the third embodiment of the present invention. Now, the data output operation of the NAND-type flash memory device will be described more fully hereinafter.

Referring now to FIG. 12, upon a read operation command, a command register 590 enables an operation mode flag signal Flag_mode indicating a read operation. Thereafter, column and row addresses for addressing memory cells are successively inputted through the first input/output pins I/Oi 640. The inputted column and address data are stored in a column address register 540 and a row address register 520 through an address buffer circuit 510 under the control of a control logic 600, respectively. An operation associated with address input is carried out same as the above-explained operation, so that its description will be skipped herein. The control logic 600 generates internal signals for a reading operation to control a page buffer circuit 560. That is, the page buffer circuit 560 senses data of a memory cell of a selected page. During the sensing operation, the NAND-type flash memory device retains BUSY state. That is, during the sensing operation, an R/$\overline{B}$ signal retains low level indicating BUSY state.

When the sensed data of the memory cell of the selected page are stored in the page buffer circuit 560, the NAND-type flash memory device enters STANDBY state to output the data temporarily stored of the memory cell to exterior of the memory device. When the NAND-type flash memory device is changed from BUSY state to STANDBY state, a column address register 540 sequentially increases column addresses with a high-to-low transition of the data output signal $\overline{RE}$. And, a column decoder circuit 550 and a column gate circuit 570 select a latch group of the page buffer circuit 560 in response to column addresses sequentially outputted from the column address register 540. The stored data in the selected latch group is outputted to exterior of the memory device through an input/output buffer circuit 580.

When logic states of the external control signals CLE, ALE, $\overline{RE}$, and $\overline{WE}$ match an address input condition (e.g., CLE='H', ALE='H', $\overline{RE}$='H, and $\overline{WE}$=toggle) during the data output operation, as shown in FIG. 12, a detection circuit 610 enables a set signal SET for column address offset change in response to a first high-to-low transition of the $\overline{WE}$. And, the next-directly column address is stored in the column address register 540 through an address buffer circuit 510, as mentioned above. The detection circuit 610 enables a reset signal RESET in response to a third low-to-high transition of the $\overline{WE}$, and disables an address input period signal nADD_IN.

Synchronized with a high-to-low transition of the $\overline{RE}$, remaining data is outputted to exterior of the memory device through an input/output buffer circuit 580. The remaining data is sequentially outputted from a selected latch group of a page buffer circuit corresponding to-a newly inputted column address.

It will be understood to those skilled in the art that the third embodiment has the same effects as the firsthand second embodiments. That is, a page size of the NAND-type flash memory device can be increases irrespective of a memory n system. As a result, a high read/write operation of the NAND-type flash memory device can be achieved.

In embodiments according to the present invention, an address input period signal nADD_IN may be controlled to be disabled with a third low-to-high transition of a signal, $\overline{WE}$. On the other hand, an address input period signal nADD_IN may be controlled to be enabled with a first low-to-high transition thereof. A detection signal for outputting set and reset signals SET and RESET may be constructed using a counter circuit and logic gate circuits to perform such a function. That is, the disable point of the address input period signal nADD_IN can variously be changed. Following a column address, the same row address can be inputted during the nADD_IN enable period, as shown in the timing charts. Alternatively following the column address, a row address is not provided.

As explained so far, a column address of a column address register is changed to an externally inputted column address during data input/output, enlarging a page size of a NAND-type flash memory device irrespective of a memory application system. Advantageously, the present invention achieves a high-speed read/write operation of the NAND flash memory device.

It will be obvious to those having skill in the art that many changes may be made in the above-described details of a preferred embodiment of the present invention without departing from the underlying principles thereof. The scope of the present invention should, therefore, be determined only by the following claims.

What is claimed is:

1. A nonvolatile semiconductor memory device including a memory and a memory controller, in which the memory has a memory cell array having a matrix of rows and columns; and a plurality of latch groups for storing data to be written/read in/from the memory cell array, the nonvolatile semiconductor memory device further comprising:

an address buffer circuit for receiving and storing external addresses from a first input/output pins;

a column address register for receiving an address of the external addresses stored in the address buffer circuit as a column address, and sequentially increasing the column address;

a selection circuit for selecting a latch group of the plurality of latch groups in response to the column address sequentially outputted from the column address register;

a data input/output circuit for transferring data inputted through a second input/output pins to the selected latch group by being synchronized with a data input signal provided from the memory controller, and transferring the stored data in the selected latch group to the second input/output pins by being synchronized with a data output signal provided from the memory controller; and a controller for controlling the address buffer circuit and the column address register to store the column address of the external addresses in the column address register when the external addresses are applied to the first input/output pins, while the stored data in the selected latch group is transferred to the second input/output pins or the data inputted through the second input/output pins is transferred to the selected latch group.

2. The nonvolatile semiconductor memory device of claim 1, wherein the memory cell array comprises a main field array and a spare field array;

wherein the main field array comprises normal data bits, and the spare field array comprises additional data bits associated with the normal data bits.

3. The nonvolatile semiconductor memory device of claim 2, wherein an address of the external addresses, which are applied to the first input/output pins while the data in the selected latch group is transferred the second input/output pins or vice versa, is used as a row address of the spare field array.

4. The nonvolatile semiconductor memory device of claim 1, wherein the controller is enabled when a column address change command is inputted through the first input/output pins.

5. The nonvolatile semiconductor memory device of claim 4, wherein the controller comprises:

a command register for generating a first flag signal indicating a column address change in response to the column address change command inputted through the first input/output pins;

a short pulse generation circuit for generating a short pulse signal in response to the first flag signal;

an address input period setting circuit for enabling an address input period signal indicating a predetermined address input period in response to the short pulse signal; and a control logic for generating an address input control signal and an address latch control signal in response to the activation of the address input period signal;

wherein the address buffer circuit stores the external addresses applied to the first input/output pins in response to the address input control signal, and the column address register receives the column address from the external addresses stored in the address buffer circuit in response to the address latch control signal.

6. The nonvolatile semiconductor memory device of claim 5, wherein the controller further comprises a detection circuit for detecting whether the predetermined address input period is finished, in response to external control signals CLE, ALE, /WE, and/RE provided from the memory controller and for generating a reset signal;

wherein the address input period signal is disabled by the reset signal.

7. The nonvolatile semiconductor memory device of claim 6, wherein the command register generates a second flag signal in response to a read operation/successive data input operation command from the first input/output pins;

wherein the detection circuit detects whether the address input period is started, in response to the external control signals CLE, ALE, /WE, and /RE, when the second flag signal is enabled, and generates a set signal;

wherein the address input period signal is enabled by the set signal.

8. The nonvolatile semiconductor memory device of claim 1, wherein the controller is enabled by a combination of external control signals CLE, ALE, /WE, and /RE provided from the memory controller.

9. The nonvolatile semiconductor memory device of claim 8, wherein the controller comprises:

a first detection circuit for detecting whether the combination of the external control signals CLE, ALE, /WE, and /RE indicates column address change, and generating a first flag signal indicating column address change of the column address register;

a short pulse generation circuit for generating a short pulse signal in response to the first flag signal;

an address input period setting circuit for enabling an address input period signal indicating a predetermined address input period in response to the short pulse signal; and a control logic for generating an address input control signal and an address latch control signal in response to the address input period signal;

wherein the address buffer circuit stores the external addresses applied to the first input/output pins in response to the address input control signal, and the column address register receives the column address from the external addresses stored in the address buffer circuit in response to the address latch control signal.

10. The nonvolatile semiconductor memory device of claim 9, wherein the controller further comprises a second detection circuit;

wherein the second detection circuit receives the external control signals CLE, ALE, /WE, and /RE, detects whether the address input period is finished, and generates a reset signal;

wherein the address input period signal is disabled by the reset signal.

11. The nonvolatile semiconductor memory device of claim 10, wherein the controller further comprises a command register for generating a second flag signal in response to a read operation/successive data input operation command from the first input/output pins;

wherein the second detection circuit detects whether the address input period is started, in response to the external control signals CLE, ALE, /WE, and /RE, and generates a set signal;

wherein the address input signal is enabled by the set signal.

12. The nonvolatile semiconductor memory device of claim 1, wherein the controller is enabled whenever logic states of external control signals ALE, CLE, /WE, and /RE provided from the memory controller match an address input condition.

13. The nonvolatile semiconductor memory device of claim 12, wherein the controller includes:

an address input period setting circuit for generating an address input signal indicating a predetermined address input period;

a control logic for generating an address input control signal and an address latch control signal in response to the activation of the address input period signal;

a detection circuit for receiving the external control signals CLE, ALE, /WE, and /RE, for detecting a start point of the address input period to output a set signal, and for detecting a finish point of the address input period to output a reset signal;

wherein the address input period signal is enabled by the set signal and is disabled by the reset signal; the address buffer circuit stores the external addresses applied to the first the input/output pins in response to the address input control signal; and the column address register receives the column address from the external addresses stored in the address buffer circuit in response to the address latch control signal.

14. A flash memory device including memory cell arrays and a memory controller, in which the memory cell array having electrically erasable and programmable memory cells arranged in a matrix of rows and columns, the memory cell array comprising a main field array and a spare field array, further comprising;

a plurality of latch groups for temporarily storing data to be stored/read in/from the memory cell array, wherein the data comprises normal data bits to be stored in the main field array and additional data bits, associated with the normal data bits, to be stored in the spare field array;

an address buffer circuit for storing external addresses provided to a first input/output pins;

a column address register for receiving an address of the external addresses stored in the address buffer circuit as a column address, and for sequentially increasing the column address;

a selection circuit for sequentially selecting a latch group of the plurality of latch groups in response to the column address outputted from the column address register;

a data input/output circuit for transferring data sequentially inputted from a second input/output pins to a selected latch group of the plurality of latch groups by being synchronized with a data input signal provided from the memory controller, and for transferring the stored data in the selected latch group to the second input/output pins by being synchronized with a data output signal provided from the memory controller;

a command register for generating a flag signal indicating column address change in response to a column address change command;

a short pulse generation circuit for generating a short pulse signal in response to the flag signal;

an address input period setting circuit for enabling an address input period signal indicating a predetermined address input period in response to the short pulse signal; and a control logic for controlling the address buffer circuit and the column address register in response to the activation of the address input period signal so that the column address of the external addresses is stored in the column address register.

15. The flash memory device of claim 14 further comprising a detection circuit for detecting whether the address input period is finished in response to external control signals CLE, ALE, /WE, and /RE provided from the memory controller, and generating a reset signal.

16. The flash memory device of claim 14, wherein the command register generates a second flag signal in response to a read operation/successive data input operation command;

wherein the detection circuit detects whether the address input period is started in response to the external control signals CLE, ALE, /WE, and /RE, generates a set signal wherein the address input period signal is enabled by the set signal.

17. The flash-memory device of claim 14, wherein the control logic generates an address input control signal and an address latch control signal;

wherein the address buffer circuit stores the external addresses applied to the first input/output pins in response to the address input control signal; and wherein the column address register receives the column address of the external addresses stored in the address buffer circuit in response to the address latch control signal.

18. The flash memory device of claim 14, wherein the external addresses, which is applied to the input/output pins while the data is transferred from the second input/output pins to the select latch group or vice versa, is used for addressing columns of the spare field.

19. The flash memory device of claim 14, wherein the number of latches in the respective latch group corresponds to that of the second input/output pins.

20. A flash memory device including memory cell arrays and a memory controller, in which the memory cell arrays having electrically erasable and programmable memory cells arranged in a matrix of rows and columns, the memory cell array comprising a main field array and a spare field array, further comprising:

a plurality of latch groups for temporarily storing data to be stored/read in/from the arrays, wherein the data comprising normal data bits to be stored in the main field array and additional data bits, associated with the normal data bits, to be stored in the spare field array;

an address buffer circuit for storing external addresses provided from a first input/output pins;

a column address register for receiving an address of the external addresses stored signals in the address buffer circuit as a column address, and for sequentially increasing the column address;

a selection circuit for sequentially selecting a latch group of the plurality of latch groups in response to the column address outputted from the column address register;

a data input/output circuit for transferring data sequentially inputted from a second input/output pins to a selected latch group of the plurality of latch groups by being synchronized with a data input signal provided from the memory controller, and for transferring the stored data in the selected latch group to the second input/output pins by being synchronized with a data output signal provided from the memory controller;

a first detection circuit for detecting whether a combination of external control signals CLE, ALE, /WE, and /RE from the memory controller indicates column address change, and generating a flag signal indicating column address change;

a short pulse generation circuit for generating a short pulse signal in response to the flag signal;

an address input period setting circuit for enabling an address input period signal indicating a predetermined address input period in response to the short pulse signal; and a control logic for controlling the address buffer circuit and the column address register in response to the activation of the address input period signal so that the external addresses provided from the first input/output pins are stored in the column address register.

21. The flash memory device of claim 20, further comprising a second detection circuit for detecting whether the address input period is finished in response to the external control signals CEL, ALE, /WE, and /RE, and generating a reset signal;

wherein the address input period signal is disabled by the reset signal.

22. The flash memory device of claim 21 further comprising a command register for generating a second flag signal in response to a read operation/data input operation command, wherein the second detection circuit detects whether the address input period is started in response to the external control signals CLE, ALE, /WE, and /RE when the second flag signal is enabled, and generates a set signal;

wherein the address input period signal is enabled by the set signal.

23. The flash memory device of claim 20, wherein the control logic generates an address input control signal and an address latch control signal in response to the address input period signal;

wherein the address buffer circuit stores the external addresses applied to the first input/output pins in response to the address input control signal, and the column address register receives the column address of the stored external addresses in response to the address latch control signal.

24. The flash memory device of claim 20, wherein the external addresses, which are applied to the first input/output pins while the data is transferred from the selected latch group to the input/output pins or vice versa, are used for addressing columns of the spare field.

25. The flash memory device of claim 20, wherein the number of the latches of the respective latch group correspond to that of the first input/output pins.

26. A flash memory device comprising:

a memory cell array having electrically erasable and programmable memory cells arranged in a matrix of rows and columns, the memory cell array comprising a main field array and a spare field array;

a plurality of latches for temporarily storing data column to be stored/read in/from the array, the latches being divided into a plurality of latch groups, wherein the data column is composed of normal data bits to be stored in the main field array and additional data bits, associated with the normal data bits, to be stored in the spare field array;

an address buffer circuit for storing signals provided to input/output pins as an address;

a column address register for receiving the signals stored in the address buffer circuit as a column address, and for sequentially increasing the received column address;

a selection circuit for sequentially selecting the latch groups of the plurality of latch groups in response to the column address outputted from the column address register;

a data input/output circuit for transferring data columns sequentially inputted from the input/output pins to the latches of the selected groups by being synchronized with a data input signal, and for transferring the stored data columns to the input/output pins by being synchronized with a data output signal;

an address input period setting circuit for generating an address input period signal indicating a predetermined address input period in response to a set signal and a reset signal;

a control logic for controlling the address buffer circuit and the column address register in response to the address input period signal so that an external address provided to the input/output pins is stored in the column address register; and a detection circuit for receiving external control signals CLE, ALE, /WE, and /RE, for detecting a start point of the address input period to output the set signal for enabling the address input period signal, and for detecting a finish point of the address input period to output the reset signal for disabling the enabled address input period signal;

wherein the address buffer circuit stores the external address applied to the input/output pins in response to the address input control signal, and the column address register receives the stored external address in response to the address latch control signal.

27. The flash memory device of claim 26, wherein the external address, which is applied to the input/output pins while the data column is transferred from the input/output pins to the latches of the selected groups or vice versa, is used for addressing columns of the spare field.

28. The flash memory device of claim 26, wherein the latches of the respective latch group correspond to the input/output pins in number.

29. A system including a memory controller that receives normal data from a host to internally generate additional data associated with the normal data, and has a buffer memory for temporarily storing the normal data and the additional data; and a flash memory device that is coupled to the memory controller, and stores a data comprised of the normal data and the additional data;

wherein the flash memory device comprises:

a memory cell array having electrically erasable and programmable memory cells arranged in a matrix of rows and columns, the memory cell array comprising a main field array and a spare field array, wherein the normal data is stored in the main field array and the additional data is stored in the spare field array;

a plurality of latch groups for temporarily storing the data to be stored in the memory cell array or storing the data read from the array;

an address buffer circuit for storing external addresses provided from a first the input/output pins;

a column address register for receiving an address of the external addresses stored in the address buffer circuit as a column address, and for sequentially increasing the column address;

a selection circuit for sequentially selecting a latch group of the plurality of latch groups in response to the column address outputted from the column address register;

a data input/output circuit for transferring data sequentially inputted through a second input/output pins to the selected latch group by being synchronized with a data input signal provided from the memory controller, and for transferring the stored data in the selected latch group to the input/output pin by being synchronized with a data output signal provided from the memory controller; and a controller for controlling the address buffer circuit and the column address register to store the column address of the external addresses in the column address register when the external addresses are applied to the first input/output pins while the data is transferred from the selected latch group to the second input/output pins or vice versa.

30. The system of claim 29, wherein the controller comprises:

a command register for generating a first flag signal indicating a column address change in response to a command inputted through the first input/output pins;

a short pulse generation circuit for generating a short pulse signal in response to the first flag signal;

an address input period setting circuit for enabling an address input period signal indicating a predetermined address input period in response to the short pulse signal; and a control logic for generating an address input control signal and an address latch control signal in response to the activation of the address input period signal; and a detection circuit for detecting whether the address input period is finished in response to external control signals CLE, ALE, /WE, and /RE provided from the memory controller, and generating a reset signal;

wherein the address input period signal is disabled by the reset signal; the address buffer circuit stores the external addresses applied to the input/output pins in response to the address input control signal; and the column address register receives the column address of the stored external address in response to the address latch control signal.

31. The system of claim 30, wherein the command register generates a second flag signal in response to a read operation/successive data input operation command; the detection circuit detects whether an address input period is started in response to the external control signals CLE, ALE, /WE, and /RE when the second flag signal is enabled, and generates a set signal;

wherein the address input period signal is enabled by the set signal.

32. The flash memory device of claim 30, wherein the controller includes:

a first detection circuit for detecting whether a combination of the external control signals CLE, ALE, /WE, and /RE provided from the memory controller indicates column address change, and generating a first flag signal indicating column address change of the column address register;

a short pulse generation circuit for generating a short pulse signal in response to the first flag signal;

an address input period setting circuit for enabling an address input period signal indicating a predetermined address input period in response to the short pulse signal;

a control logic for generating an address input control signal and an address latch control signal in response to the address input period signal; and a second detection circuit for receiving the external control signals CLE, ALE, /WE, and /RE and detecting whether the address input period is finished, and generating a reset signal;

wherein the address input period signal is disabled by the reset signal; the address buffer circuit stores the external addresses applied to the first input/output pins in response to the address input control signal; and the column address register receives the column address of the stored external addresses in response to the address latch control signal.

33. The system of claim 32, further comprising a command register for generating a second flag signal in response to a read operation/successive data input operation command, wherein the second detection circuit detects whether the address input period is started in response to the external control signals CLE, ALE, /WE, and /RE when a second flag signal is enabled, and generates a set signal;

wherein the address input period signal is enabled by the set signal.

34. The system of claim 30, wherein the controller includes:

an address input period setting circuit for generating an address input period signal indicating an address input period in response to a set signal and a reset signal;

a control logic for generating an address input control signal and an address latch control signal in response to the activation of the address input period signal; and a detection circuit for receiving external control signals CLE, ALE, /WE, and /RE provided from the memory controller and detecting a start point of the address input period to output a set signal for enabling the address input period signal, and detecting a finish point of the address input period to output a reset signal for disabling the enabled address input period signal;

wherein the address buffer circuit stores the external addresses applied to the first input/output pins in response to the address input control signal, and the column address register receives the column address of the stored external addresses in response to the address latch control signal.

35. A method for controlling data input/output of a nonvolatile semiconductor memory device including a memory cell array having electrically erasable and programmable memory cells arranged in a matrix of rows and columns, the memory cell array comprising a main field array and a spare field array; a plurality of latch groups for temporarily storing data to be stored/read in/from the array;

wherein the data comprises normal data bits to be stored in the main field array and additional data bits, associated with the normal data bits, to be stored in the spare field array; an address buffer circuit for storing external addresses provided from a first input/output pins; and a column address register for receiving an address of the external addresses stored in the address buffer circuit as a column address, and for sequentially increasing the column address, the method comprising the steps of:

(a) sequentially selecting a latch group of the plurality of latch groups in response to the column address outputted from the column address register;

(b) transferring the data from a second input/output pins to the selected latch group by being synchronized with a data input signal provided from the memory controller;

(c) storing an address of the external addresses in the column address register as a new column address when the external addresses are applied to the memory device while the data is transferred/outputted to/from the selected latch group; and (d) performing the step of (b) according to the new column address.

36. The method of claim 35, wherein the step (c) comprises the steps of (e) generating a flag signal indicating column address change in response to a column address change command; (f) generating a short pulse signal in response to the flag signal; (g) enabling an address input period signal indicating a predetermined address input period in response to the short pulse signal; (h) generating an address, input control signal and an address latch control signal in response to the activation of the address input period signal; and (i) generating a reset signal indicating finish of the address input period in response to external control signals CLE, ALE, /WE, and /RE provided from the memory controller;

wherein the address input period signal is disabled by the reset signal; the address buffer circuit stores the external addresses applied to the input/output pins in response to the address input control signal; and the column address register receives the column address of the stored external addresses in response to the address latch control signal.

37. The method of claim 35, wherein the step (c) comprises the steps of (e) detecting whether a combination of the external control signals CLE, ALE, /WE, and /RE informs column address change to generate a flag signal indicating the column address change; (f) generating a short pulse signal in response to the flag signal; (g) enabling an address input period signal indicating a predetermined address input period in response to the short pulse signal; (h) generating an address input control signal and an address latch control signal in response to the activation of the address input period signal; and (i) generating a reset signal indicating finish of the address input period in response to the external control signals CLE, ALE, /WE, and /RE;

wherein the address input period signal is disabled by the reset signal; the address buffer circuit stores the external addresses applied to the input/output pins in response to the address input control signal; and the column address register receives the column address of the stored external addresses in response to the address latch control signal.

38. The method of claim 35, wherein the step (c) comprises the steps of (e) receiving external control signals CLE, ALE, /WE, and /RE and detecting an address input start point to enable an address input period signal; (f) generating an address input control signal and an address latch control signal in response to the activation of the address input period signal; (g) receiving the external control signals CLE, ALE, /WE, /RE and detecting a finish point of the address input period to disable the enabled address input period;

wherein the address buffer circuit stores the external addresses applied to the input/output pins in response to the address input control signal; and the column address register receives the column address of the stored external address in response to the address latch control signal.

* * * * *